(12) United States Patent
Wu et al.

(10) Patent No.: US 11,756,801 B2
(45) Date of Patent: Sep. 12, 2023

(54) STENCIL STRUCTURE AND METHOD OF FABRICATING PACKAGE

(71) Applicant: Taiwan Semiconductor Manufacturing Company, Ltd., Hsinchu (TW)

(72) Inventors: Jiun-Yi Wu, Taoyuan (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 75 days.

(21) Appl. No.: 17/371,020

(22) Filed: Jul. 8, 2021

(65) Prior Publication Data

US 2023/0009506 A1   Jan. 12, 2023

(51) Int. Cl.
*H01L 21/48* (2006.01)
*H01L 23/00* (2006.01)
*H01L 21/67* (2006.01)

(52) U.S. Cl.
CPC ...... *H01L 21/4853* (2013.01); *H01L 21/4857* (2013.01); *H01L 21/67121* (2013.01); *H01L 24/97* (2013.01)

(58) Field of Classification Search
CPC ............. H01L 21/4853; H01L 21/4857; H01L 21/67121; H01L 24/97
See application file for complete search history.

(56) References Cited

U.S. PATENT DOCUMENTS

| | | | | |
|---|---|---|---|---|
| 3,731,402 | A | * | 5/1973 | Paul ...................... G09B 11/04 434/164 |
| 3,861,066 | A | * | 1/1975 | Klaja ..................... G09B 11/04 434/87 |
| 8,993,380 | B2 | | 3/2015 | Hou et al. |
| 9,281,254 | B2 | | 3/2016 | Yu et al. |
| 9,299,649 | B2 | | 3/2016 | Chiu et al. |
| 9,372,206 | B2 | | 6/2016 | Wu et al. |
| 9,425,126 | B2 | | 8/2016 | Kuo et al. |
| 9,443,783 | B2 | | 9/2016 | Lin et al. |
| 9,461,018 | B1 | | 10/2016 | Tsai et al. |
| 9,496,189 | B2 | | 11/2016 | Yu et al. |
| 9,666,502 | B2 | | 5/2017 | Chen et al. |
| 9,735,131 | B2 | | 8/2017 | Su et al. |

FOREIGN PATENT DOCUMENTS

CN           207338360 U  *  5/2018   ......... H01L 21/4853

* cited by examiner

*Primary Examiner* — Selim U Ahmed
*Assistant Examiner* — Evan G Clinton
(74) *Attorney, Agent, or Firm* — JCIPRNET

(57) ABSTRACT

A method of fabrication a package and a stencil structure are provided. The stencil structure includes a first carrier having a groove and stencil units placed in the groove of the first carrier. At least one of the stencil units is slidably disposed along sidewalls of another stencil unit. Each of the stencil units has openings.

20 Claims, 30 Drawing Sheets

STENCIL STRUCTURE AND METHOD OF FABRICATING PACKAGE

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, more challenging issue occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
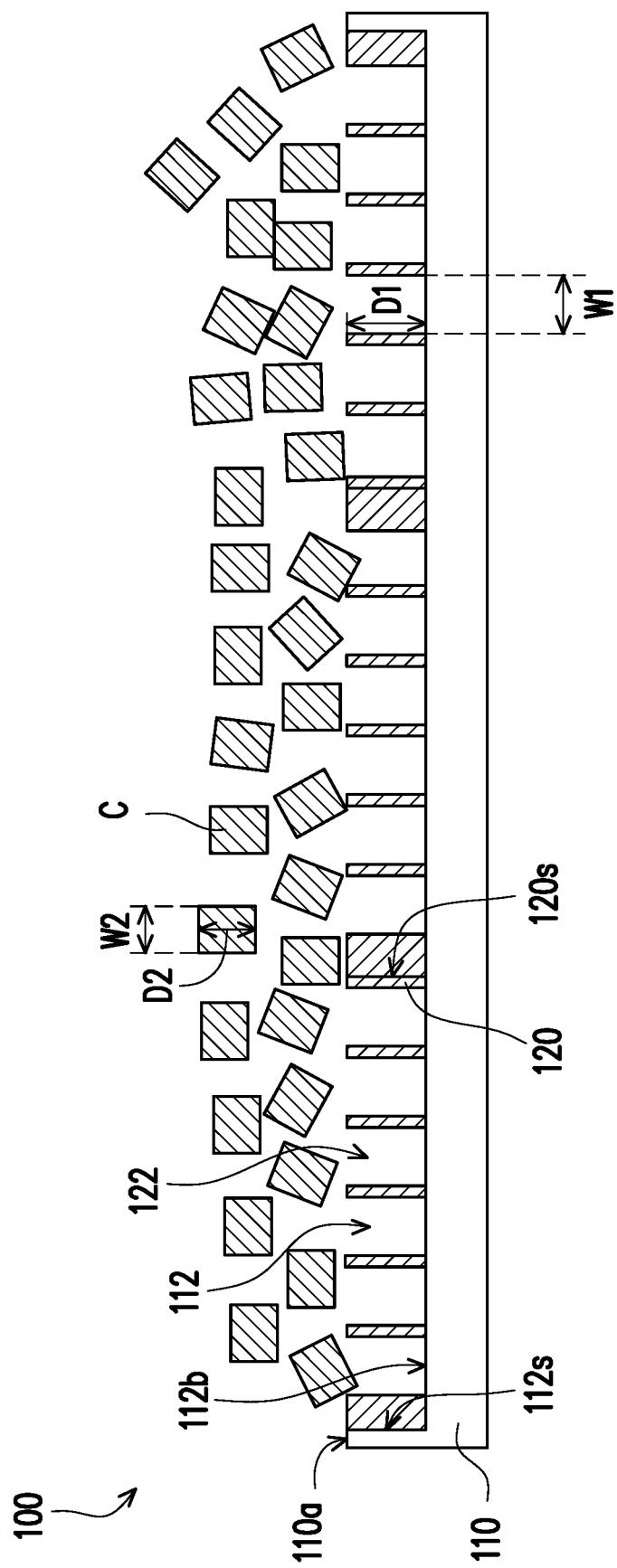
FIG. 1A to FIG. 1M are schematic cross-sectional views of various stages in a method of fabricating a package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
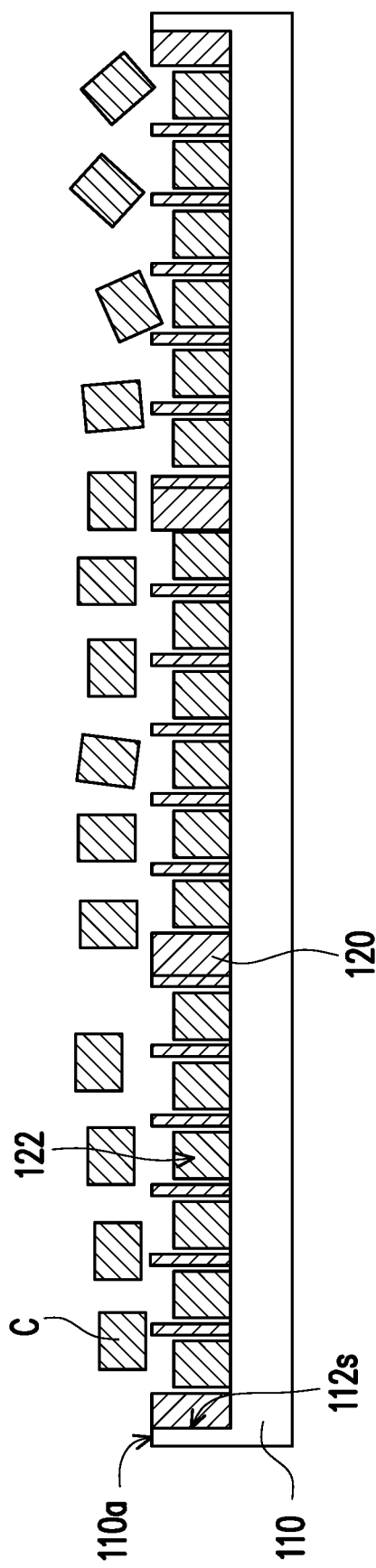

FIG. 1A to FIG. 1K are schematic cross-sectional views of various stages in a method of fabricating a package according to some exemplary embodiments of the present disclosure. FIG. 2A is a schematic top view of a stencil structure of FIG. 1A according to some exemplary embodiments of the present disclosure. Referring to FIG. 1A to 1B and FIG. 2A, a stencil structure 100 is provided. The stencil structure 100 includes a first carrier 110 and stencil units 120 disposed on the first carrier 110. In this embodiment, the stencil units 120 are placed in a groove 112 of the first carrier 110. The groove 112 is located on a first side 110a of the first carrier 110. That is, the stencil units 120 are disposed on the first side 110a of the first carrier 110.

The size of the stencil units 120 are identical to or different from each other. For example, the shape of each of the stencil units 120 is rectangle, and the stencil units 120 have the same size with each other. However, the disclosure is not limited thereto. In other embodiments, the shape of each of the stencil units 120 is triangular, pentagonal, hexagonal, circular or other geometric structures. In other embodiments, the stencil units 120 includes concentric structure. The shape of the stencil units 120 are identical to or different from each other.

In this embodiment, all of the stencil units 120 are disposed in one groove 112 of the first carrier 110, but the disclosure is not limited thereto. In other embodiments, the first carrier 110 has a plurality of grooves, and each of the grooves accommodate one or more stencil units 120. That is, in some embodiments, the stencil units 120 may be separated by the first carrier 110.

The sidewalls 120s of the stencil units 120 are perpendicular to a bottom surface 112b of the groove 112 of the first carrier 110. At least one of the stencil units 120 is slidably disposed along sidewalls 120s of another stencil unit 120. In other word, at least one of the stencil units 120 is not fixed or adhered to the first carrier 110. In some embodiments, each of the stencil units 120 is slidably disposed along sidewalls 120s of adjacent stencil units 120. That is, all of the stencil units 120 may not be fixed or adhered to the first carrier 110. In some embodiments, sidewalls 120s of the stencil units 120 adjacent to sidewalls 112s of the groove 112 are slidably disposed along sidewalls 112s of the groove 112. When the groove 112 is facing up, the stencil units 120 are in contact with the bottom surface 112b of the groove 112. If the first carrier 110 is flipped and the groove 112 is facing down, the stencil units 120 will slide along sidewalls 112s of the groove 112 and/or sidewalls 120s of the adjacent stencil units 120 in a direction perpendicular to the bottom surface 112b of the groove 112.

Each of the stencil units 120 has openings 122. Each of the openings 122 of the stencil units 120 has the same size and the same shape. For example, the shape of the openings 122 is cylinder, but the disclosure is not limited thereto. In other embodiments, each of the openings 122 is corner cylinder. A width W1 of each of the openings 122 is in a range from 250 μm to 850 μm. A depth D1 of each of the openings 122 is in a range from 200 μm to 1800 μm. In some embodiments, the openings 122 are through holes of the stencil units 120. That is, the bottom surface 11/2b of the groove 112 may be exposed by the openings 122. However, the disclosure is not limited thereto.

Conductive structures C are provided on the stencil structure 100. The conductive structures C can be introduced into the openings 122 by any suitable method. For example, a vibration force of preset magnitude is exerted on the stencil structure 100 by, for example, a normal vibration or an ultrasonic vibration to induce vibration of the stencil structure 100, thereby the conductive structures C fall into the openings 122 of the stencil structure 100.

In some embodiments, the size of each of the conductive structures C is smaller than or equal to the size of each of the openings 122. Therefore, the openings 122 can accommodate the conductive structures C. Each of the openings 122 can only accommodate one of the conductive structures C. A width W2 of each of the conductive structures C is in a range from 200 μm to 800 μm. A thickness D2 of each of the conductive structures C is in a range from 200 μm to 1500 μm.

The conductive structures C includes metal, such as copper, copper alloy or other conductive material. In some embodiments, the conductive structures C are conductive pillar, conductive ball, or conductive materials with other geometries. In some embodiments, each of the conductive structures C has the same shape with each of the openings 122 of the stencil units 120. The stencil units 120 include, for example, metal, polymer, or other suitable material. Therefore, the openings 122 will not be enlarged by the conductive structures C, avoiding the problems caused by the deformation of the openings 122.

Figure 1C:
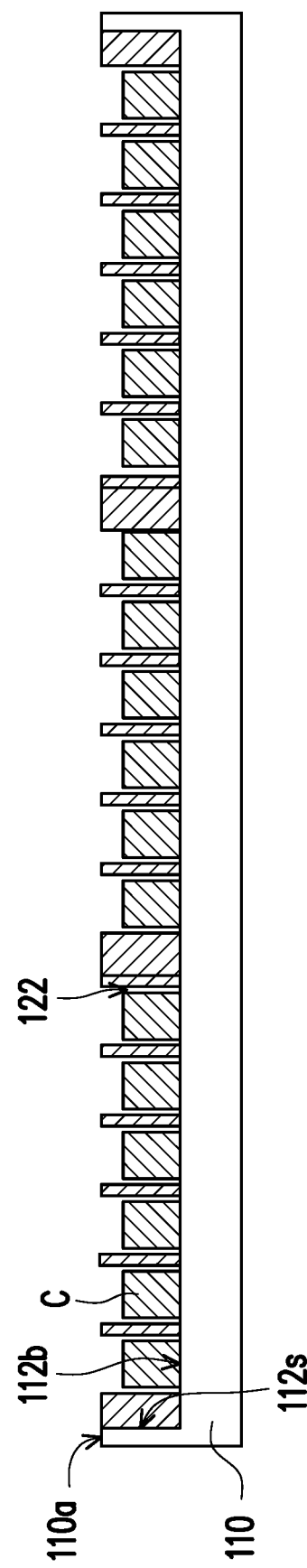
Figure 2A:
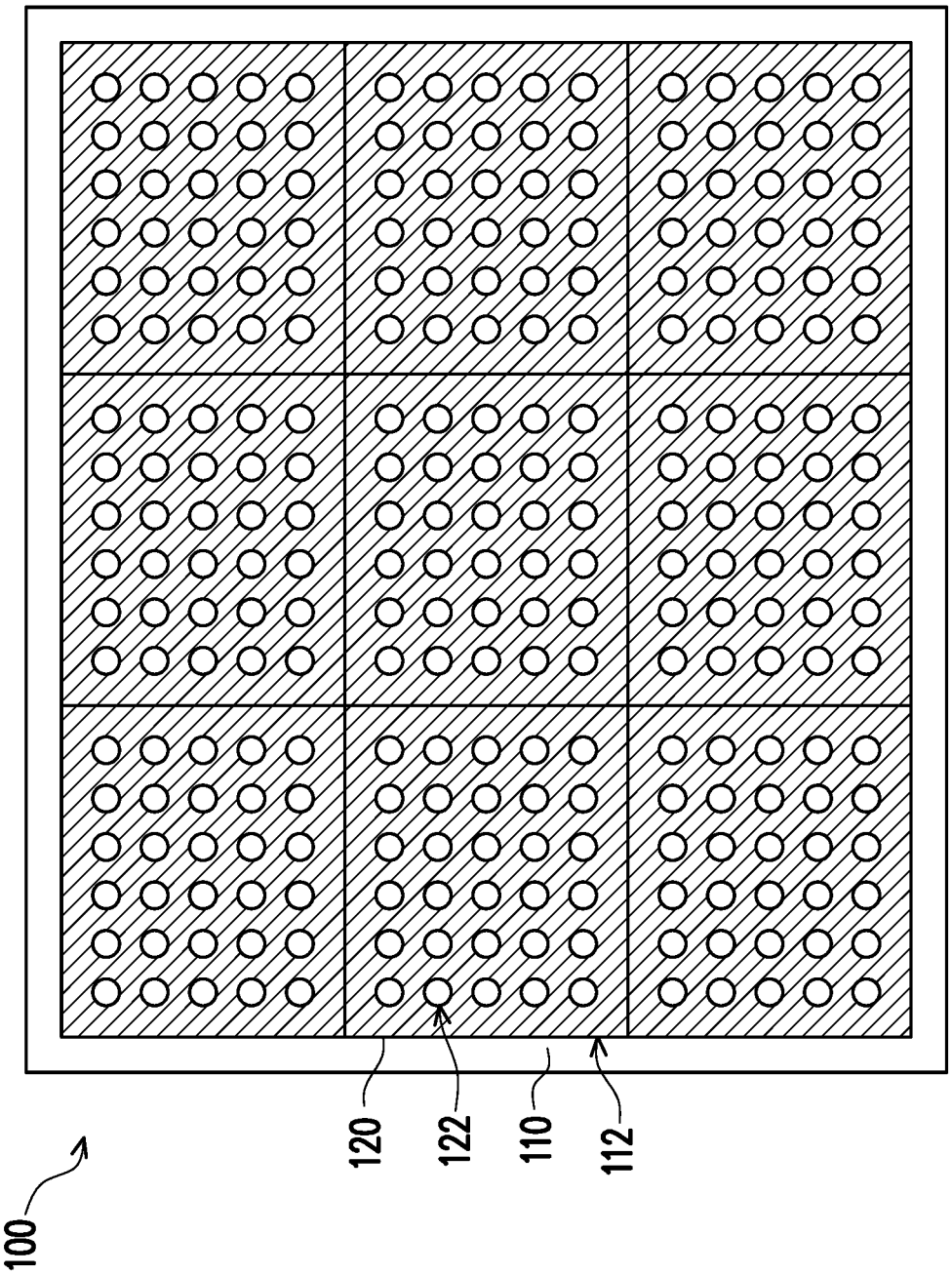
FIG. 2A is a schematic top view of a stencil structure of FIG. 1A according to some exemplary embodiments of the present disclosure.
Figure 2B:
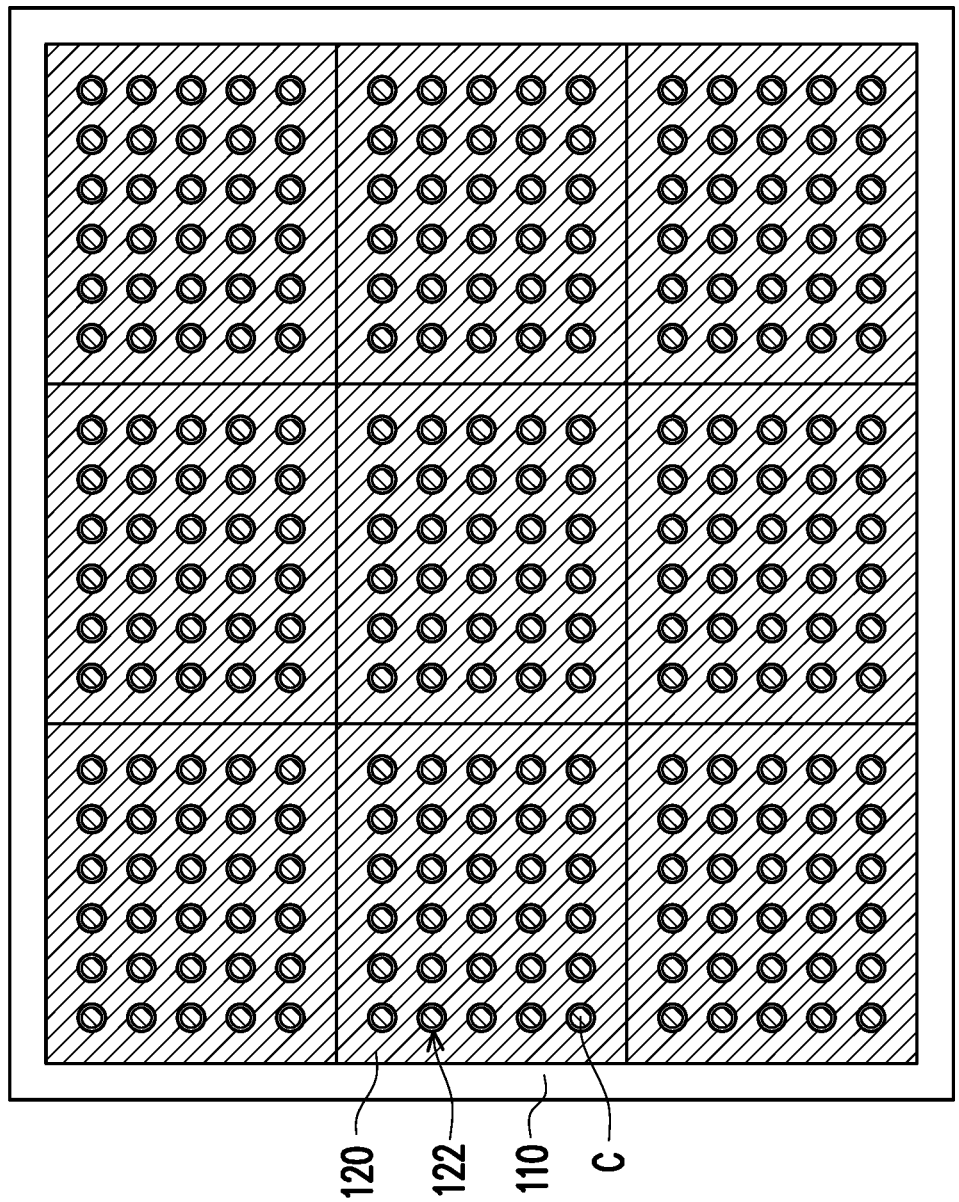
FIG. 2B is a schematic top view of a stencil structure and conductive structures of FIG. 1C according to some exemplary embodiments of the present disclosure.

FIG. 2B is a schematic top view of a stencil structure and conductive structures of FIG. 1C according to some exemplary embodiments of the present disclosure. Referring to FIG. 1C and FIG. 2B, after all of the openings 122 are filled with the conductive structures C, remove the excess conductive structures C. The conductive structures C stand upright in the openings 122.

Figure 1D:
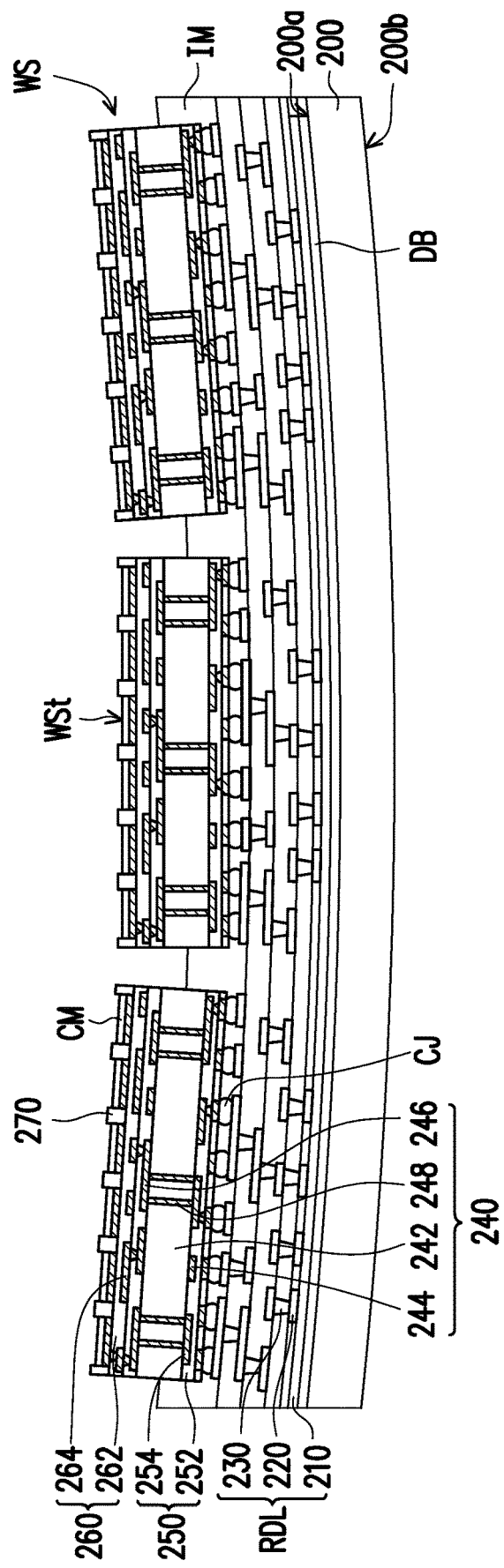

Referring to FIG. 1D, a temporary carrier 200 is provided. The temporary carrier 200 having a first surface 200a and a second surface 200b opposite to the first surface 200a. For example, a material of the temporary carrier 200 includes glass, silicon, metal, ceramic, combinations thereof, multilayers thereof, and/or the like. In some embodiments, the temporary carrier 200 is provided in a rectangular shape. Alternatively, the temporary carrier 200 may have a wafer form or other suitable shape. The temporary carrier 200 may be planar to accommodate the formation of features subsequently formed thereon. In some embodiments, the temporary carrier 200 is provided with a de-bonding layer DB to facilitate a subsequent de-bonding of the temporary carrier 200. The de-bonding layer DB may include a layer of light-to-heat-conversion (LTHC) release coating and a layer of associated adhesive. Other suitable release material (e.g., pressure sensitive adhesives, radiation curable adhesives, combinations of these, etc.), which may be removed along with the temporary carrier 200 from the overlying structures that will be formed in subsequent steps, may be used. Alternatively, the de-bonding layer DB is omitted.

A redistribution structure RDL including dielectric layers 210, conductive patterns 220 and conductive vias 230 is formed and disposed over the temporary carrier 200. For example, the dielectric layers 210 may include polybenzoxazole (PBO), polyimide (PI), benzocyclobutene (BCB), prepreg, Ajinomoto build-up film (ABF), an oxide (e.g., silicon oxide), a nitride (e.g., silicon nitride), a photosensitive polymer material, a combination thereof, and/or the like. In some embodiments, the dielectric layers 210 may include resin mixed with filler. For example, the material of the conductive patterns 220 and the conductive vias 230 may include copper or other suitable metallic materials.

In some embodiments, the redistribution structure RDL is curved. For example, the temporary carrier 200 may have a non-flat surface. Therefore, the redistribution structure RDL formed thereon is curved. A top surface (the first side 200a) of the temporary carrier 200 can be concave, convex or other kinds of uneven surface. Similarly, a top surface of the redistribution structure RDL formed on the uneven temporary carrier 200 can be concave, convex or other kinds of uneven surface. The non-flat surface of the temporary carrier 200 may be caused factors such as grinding errors, uneven force distribution, etc. As the surface area of the temporary carrier 200 increases, the problem of the non-flat surface is more likely to occur. It should be noted that the curvature of the temporary carrier 200 and the redistribution structure RDL illustrated in the figures is only for illustration, not for limitation. Actual curvature of the temporary carrier 200 and the redistribution structure RDL will vary in different embodiments. For example, the curvature of the temporary carrier 200 and the redistribution structure RDL may smaller than that shown in the figures of this disclosure.

Wiring substrates WS are disposed over and coupled to the redistribution structure RDL. For example, the wiring substrates WS are coupled with the redistribution structure RDL by the conductive joints CJ, such as solder, between the topmost conductive pattern 220 of the redistribution structure RDL and the wiring substrate WS, and then a high temperature process, such as reflow or thermal compression bonding, may be performed to melt the conductive joints CJ. The melted solder layer may thus join the wiring substrates WS and the redistribution structure RDL together. In some embodiments, reflowed regions formed by melting the solder layer are referred to as the conductive joints CJ. The conductive joints CJ may be referred to as solder joints in accordance with some embodiments. The wiring substrates WS and the redistribution structure RDL are coupled through the conductive joints CJ.

In some embodiments, each of the top surfaces WSt of the wiring substrates WS are not on the same plane since the redistribution structure RDL (and the temporary carrier 200) is curved. In some embodiments, the top surfaces WSt of some of the wiring substrates WS are not parallel with the top surfaces WSt of other wiring substrates WS.

An insulation material IM, such as an underfill material or an encapsulation material, is filled between the wiring substrates WS and the redistribution structure RDL. In certain embodiments, the insulation material IM at least fills the gaps between the wiring substrates WS and the redistribution structure RDL, and laterally encapsulate the conductive joints CJ.

In some embodiments, the respective wiring substrate WS includes a core layer 240, a first build-up layer 250 and a second build-up layer 260 disposed on two opposing sides of the core layer 240. In some embodiments, the core layer 240 includes a core dielectric layer 242, a first core conductive layer 244 and a second core conductive layer 246 disposed on two opposing sides of the core dielectric layer 242. The core dielectric layer 242 may be or may include prepreg (e.g., containing epoxy, resin, and/or glass fiber), PI, a combination thereof, or the like. However, other dielectric materials may also be used. The materials of the first core conductive layer 244 and the second core conductive layer 246 may include copper, gold, tungsten, aluminum, silver, gold, a combination thereof, or the like. In some embodiments, the first core conductive layer 242 and the second core conductive layer 246 are copper foils coated or plated on the opposite sides of the core dielectric layer 242. In some embodiments, a plurality of conductive through holes 248 penetrating through the core dielectric layer 242 provide electrical paths between the electrical circuits located on the opposite sides of the core dielectric layer 242. The first build-up layer 250 may be physically and electrically connected to the second build-up layer 260 through the conductive through holes 248.

In some embodiments, the first build-up layer 250 includes a plurality of first dielectric layers 252 and a plurality of first conductive patterns 254 alternately stacked over the first side of the core layer 240. The second build-up layer 260 may include a plurality of second dielectric layers 262 and a plurality of second conductive patterns 264 alternately stacked over the second side of the core layer 240. The via portions of the first conductive patterns 254 and the via portions of the second conductive patterns 264 may be tapered toward the core layer 240. The number of conductive patterns and the number of dielectric layers in each of the first build-up layer 250 and the second build-up layer 260 can be adjusted according to needs, the scope of the disclosure is not limited thereto. The materials of the first and second dielectric layers 252 and 262 may be or may include prepreg, PI, PBO, BCB, silicon nitride, silicon oxide, phosphosilicate glass (PSG), borosilicate glass (BSG), boron-doped phosphosilicate glass (BPSG), a combination thereof, or the like. In some embodiments, the materials of the first and second conductive patterns 254 and 264 may be or may include metal, such as aluminum, titanium, copper, nickel, tungsten, and/or alloys thereof.

In some embodiments, the wiring substrate WS includes a mask layer 270 disposed on the outermost one of the second dielectric layer 262. The mask layer 270 may include a plurality of openings that partially expose the outermost one of the second conductive pattern 264. In some embodiments, the materials of the mask layers 270 may include a chemical composition of silica, barium sulfate and epoxy resin, and/or the like. The mask layer 270 may serve as a solder mask and may be selected to prevent short, corrosion or contamination of the circuit pattern and protect circuits of the wiring substrate WS from external impacts and chemicals. In some embodiments, another mask layer (not shown) may disposed on the outermost one of the first dielectric layer 252 and include a plurality of openings that partially expose the outermost one of the first conductive pattern 254. Alternatively, the mask layers may be omitted.

Connection materials CM are disposed over the first surface 200a of the temporary carrier 200. In this embodiment, the connection materials CM are disposed over the wiring substrates WS. The connection materials CM are disposed in the openings of the mask layer 270 and on the outermost one of the second conductive pattern 264. In some embodiments, the connection materials CM are pre-solders, such as pre-solder pastes. In an alternative embodiment, the connection materials CM may be pre-solder blocks. In some embodiments, the material of the connection materials CM may include a lead-free solder material (such as Sn—Ag base or Sn—Ag—Cu base materials) with or without additional impurity (such as Ni, Bi, Sb, Au, or the like). The disclosure is not limited thereto.

Figure 1E:
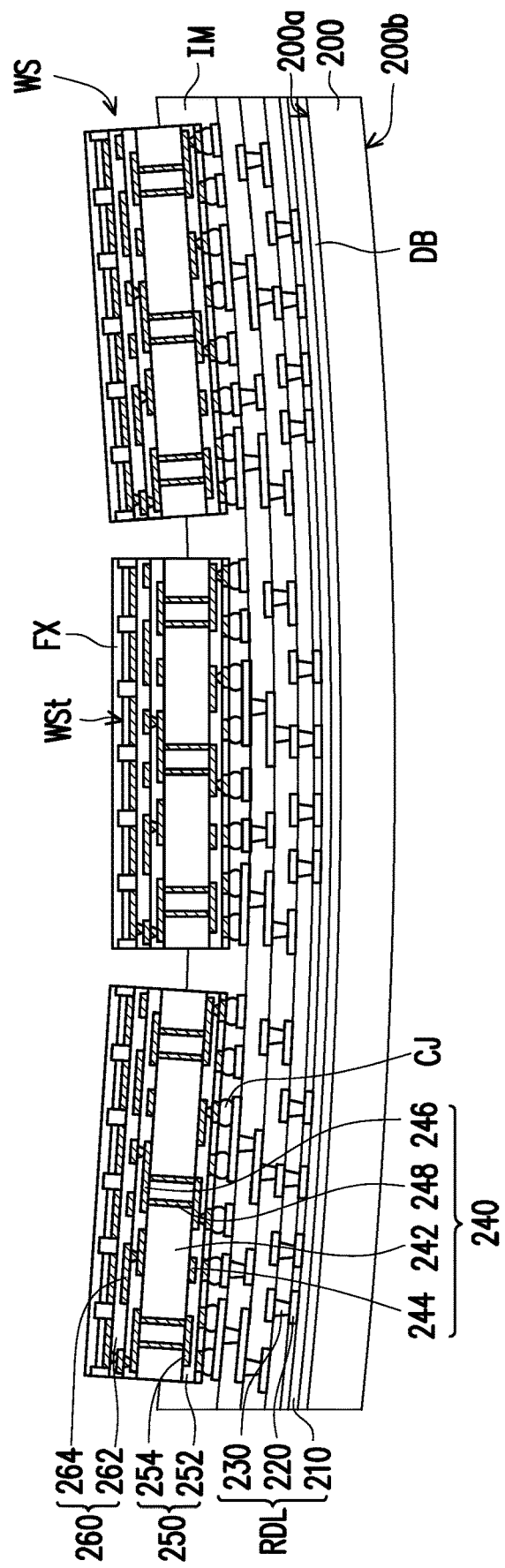

Referring to FIG. 1E, a flux FX is applied onto the exposed top surface of the connection materials CM by, for example, flux-jetting techniques which can improve the consistency of flux deposition while also enhance the robustness and flexibility of the fluxing process. In some embodiments, the flux FX is selectively disposed on the mask layer 270 and the insulation material IM.

Figure 1F:
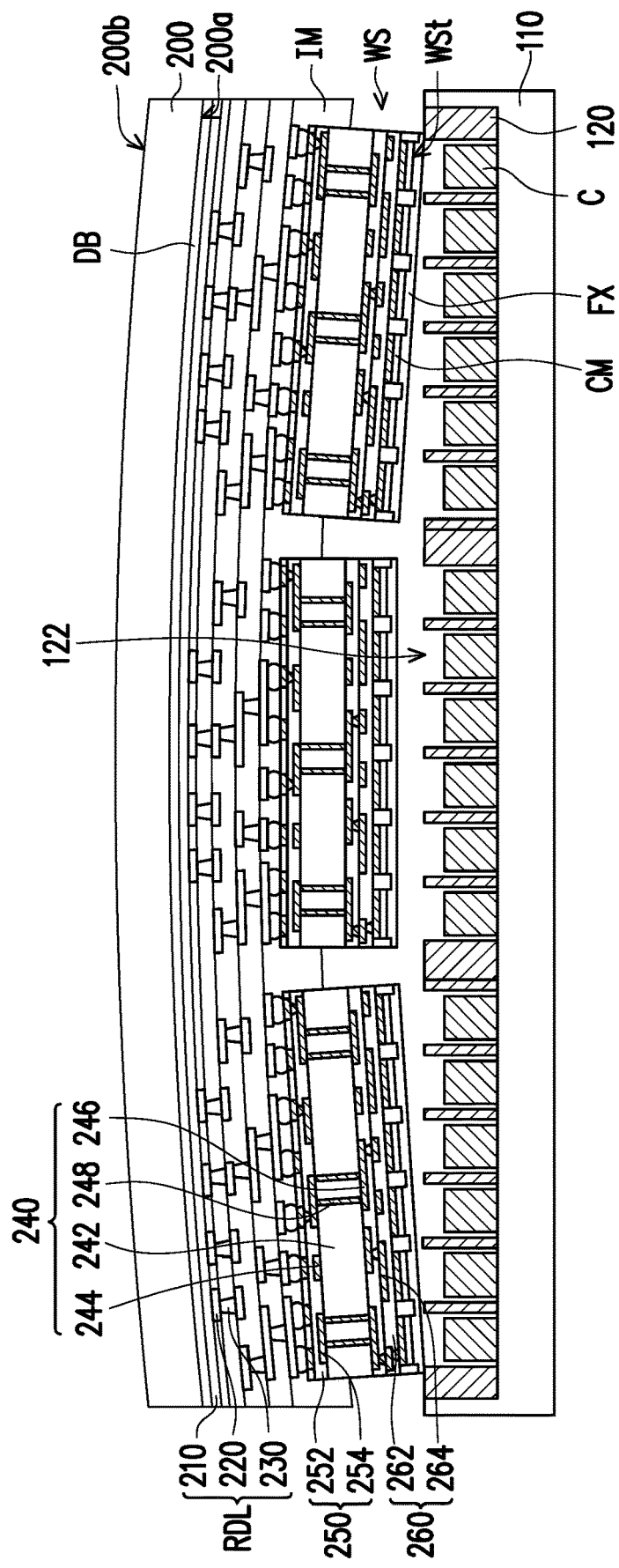

Referring to FIG. 1F, the temporary carrier 200, the redistribution structure RDL, and the wiring substrates WS are flipped so as to turn the first surface 200a of the temporary carrier 200 downward, thereby the temporary carrier 200, the redistribution structure RDL, and the wiring substrates WS cover a top surface of the stencil structure 100. The temporary carrier 200, the redistribution structure RDL, and the wiring substrates WS are overlapping with the stencil structure 100, wherein the first surface 200a of the temporary carrier 200 faces the stencil structure 100. The connection materials CM on the temporary carrier 200 are overlapping with the openings 122 of the stencil units 120, thereby the conductive structures C in the openings 122 are overlapping with the connection materials CM.

Figure 1G:
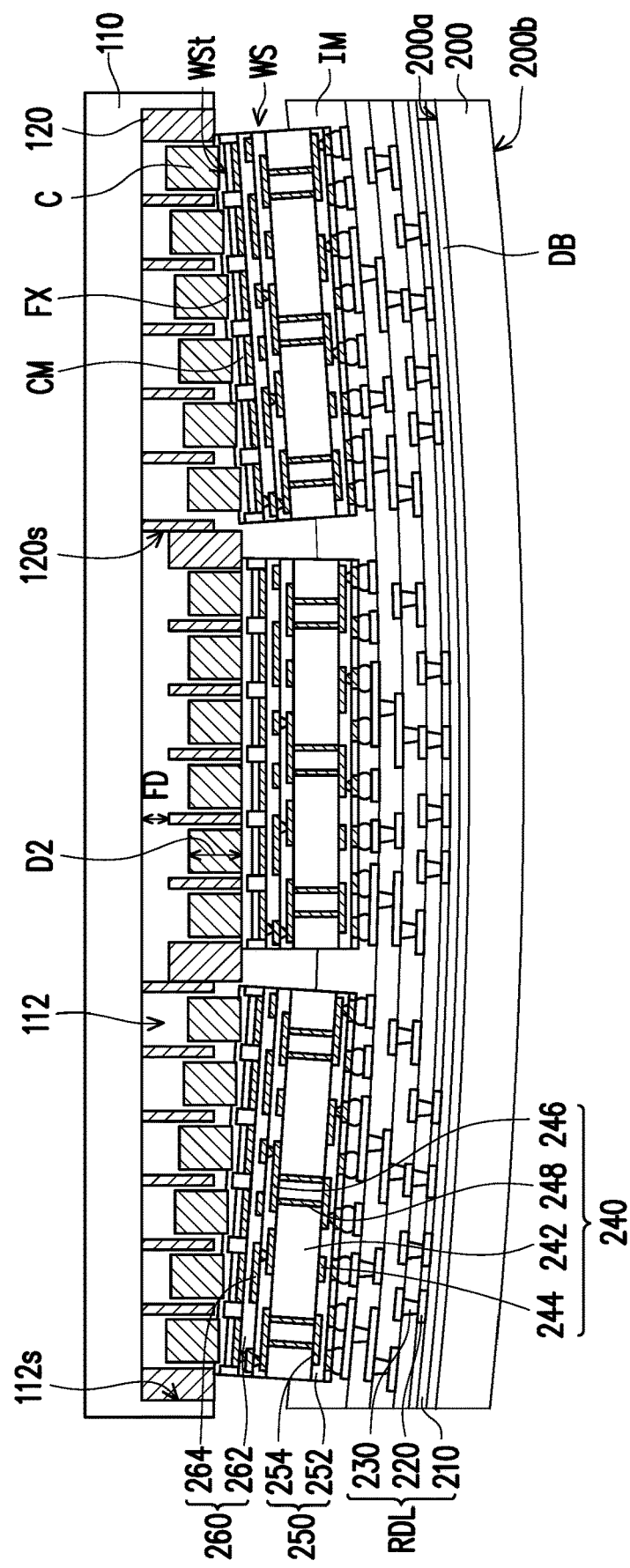

Referring to FIG. 1G, the temporary carrier 200, the redistribution structure RDL, the wiring substrates WS, and the stencil structure 100 are flipped together. Then, the conductive structures C in the stencil units 120 are falling towards the connection materials CM. Each of the conductive structures C is disposed over one corresponding connection material CM. In some embodiments, the conductive structures C is disposed on the flux FX after flipping the structure. The conductive structures C may stick to the flux FX. In some embodiments, the size of the openings 122 and the size of the conductive structures C may be smaller than the size of the openings of the mask layer 270. Therefore, the conductive structures C may be easier to enter the openings of the mask layer 270 in the subsequent process.

In some embodiments, since the top surfaces WSt of the wiring substrates WS are not on the same plane, a distance between each of the wiring substrate WS and a corresponding one stencil unit 120 are not the same with each other. Therefore, sidewalls 120s of one or more of the stencil units 120 slide along sidewalls 120s of another stencil unit 120 or along sidewalls 112s of the groove 112 of the first carrier 110, and then the one or more of the stencil units 120 fall toward a corresponding wiring substrate(s) WS. Base on the above, the arrangement of the conductive structures C in the fallen stencil units 120 can be maintained by the fallen stencil unit(s) 120, thereby preventing the overturning problem or the displacement problem of the conductive structures C. Therefore, the conductive structures C can accurately land on the connection materials CM in the subsequent process.

In some embodiments, a fall distance FD of the fallen stencil unit(s) 120 is smaller than, larger than or equal to the thickness D2 of the conductive structures C. In some embodiments. The fallen stencil units 120 may have different fall distance FD when flipping the stencil structure 100.

In some embodiments, before flipping the structure, the one or more of the stencil units 120 is not in contact with the wiring substrates WS or the flux FX. When flipping the structure, the one or more of the stencil units 120 will fall toward the corresponding wiring substrate(s) WS and then in contact with the corresponding wiring substrate(s) WS or the flux FX. That is, after flipping the structure, a vertical distance between the first carrier 110 and the one or more of the stencil units 120 is increased since the one or more of the stencil units 120 is fall, and all of the stencil units 120 are in contact with the wiring substrates WS or the flux FX.

Figure 1H:
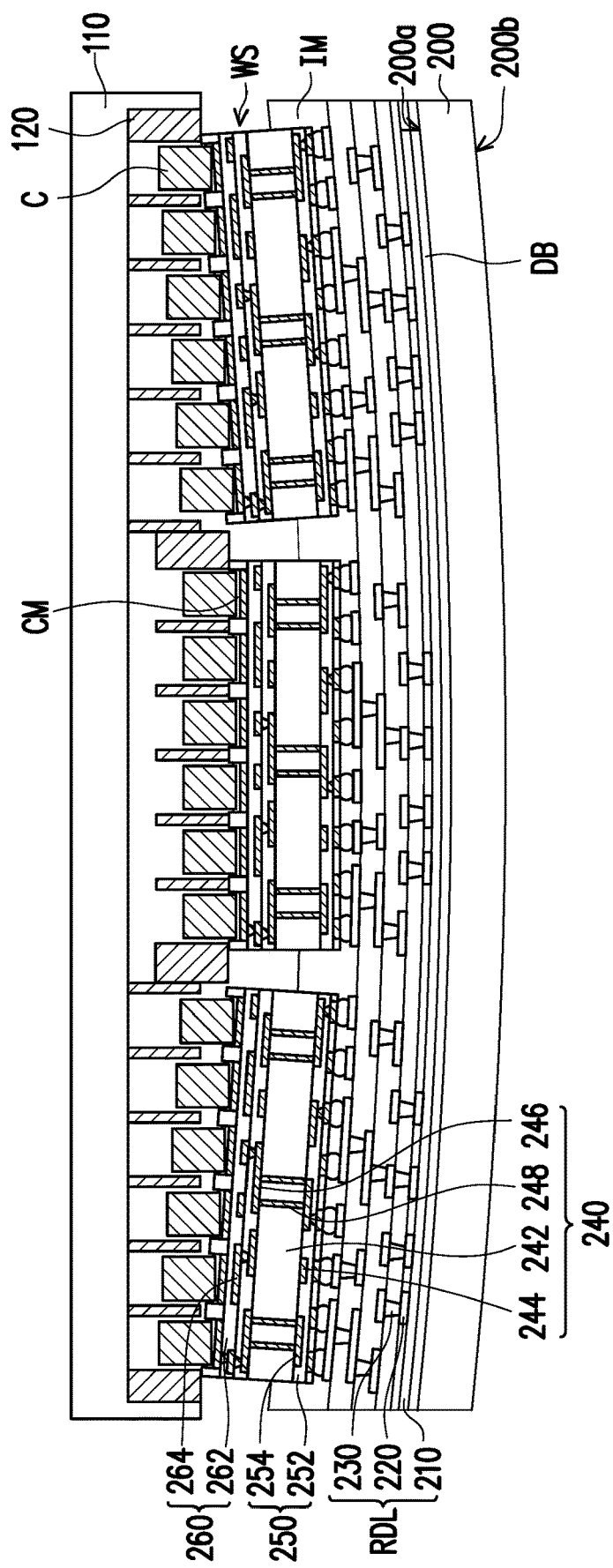

Referring to FIG. 1H, a heating process is performed to reflow the connection materials CM, thereby connecting the connection materials CM to the conductive structures C. The connection materials CM may thus join the conductive structures C and the wiring substrates WS together. In some embodiments, the flux FX may volatilize or diffuse into the connection materials CM after the heating process. That is, the flux FX is removed after the heating process. In some embodiments, after removing the flux FX, the stencil units 120 land on the mask layer 270. That is, after removing the flux FX, the stencil units 120 are in contact with the mask layer 270. In some embodiments, with the disappearance of the flux FX, the stencil units 120 and the first carrier 110 are falling toward the temporary carrier 200 until the stencil units 120 are in contact with the mask layer 270. However, the disclosure is not limited thereto. In other embodiments, the first carrier 110 is fixed in a certain height during the heating process. Therefore, after removing the flux FX by the heating process, the stencil units 120 are falling toward the temporary carrier 200 without the fall of the first carrier 110.

Figure 1I:
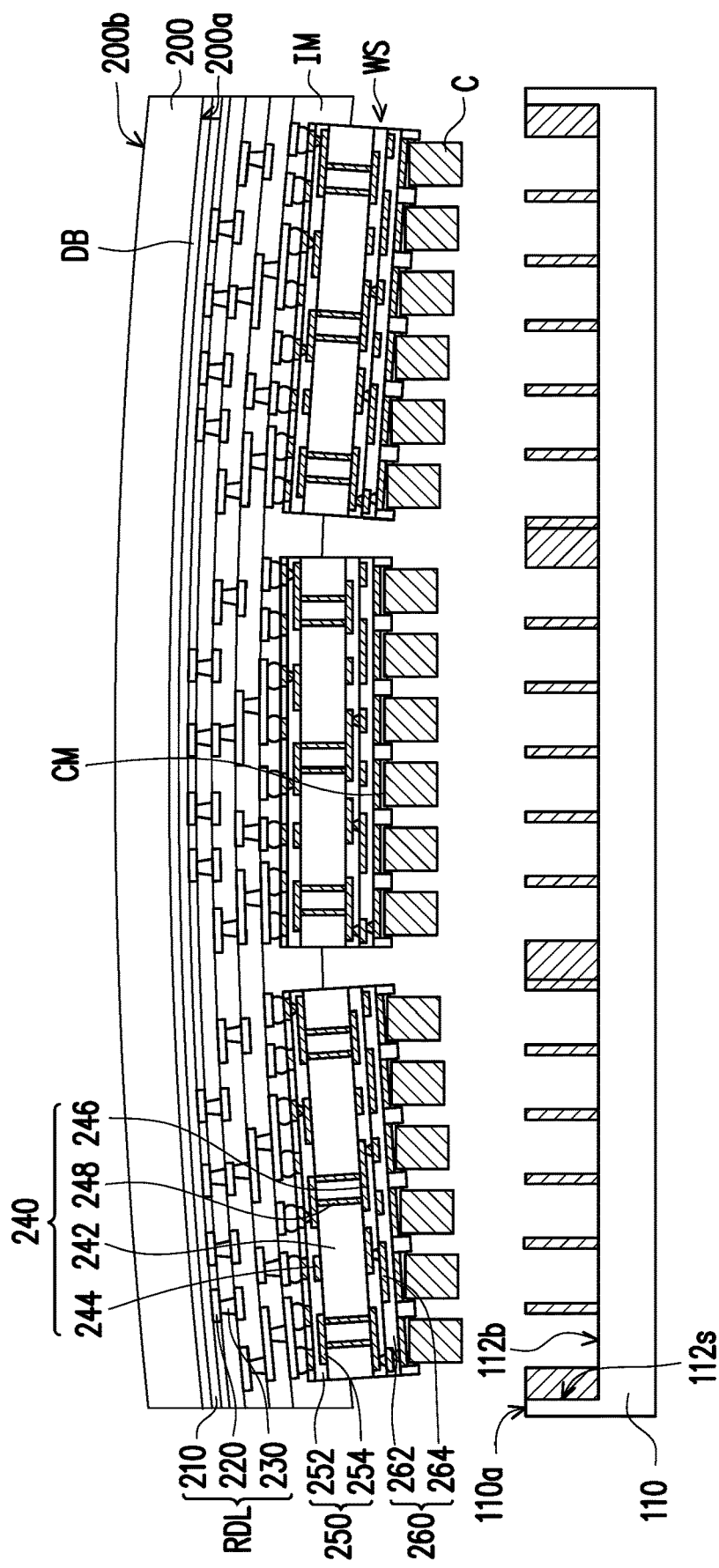

Referring to FIG. 1I, the temporary carrier 200, the redistribution structure RDL, the wiring substrates WS, and the stencil structure 100 are flipped together again. Then, the one or more of the stencil units 120 is falling towards the first carrier 110 and return to the original position. The conductive structures C remain on the wiring substrates WS. Then, the stencil structure 100 is removed.

Figure 1J:
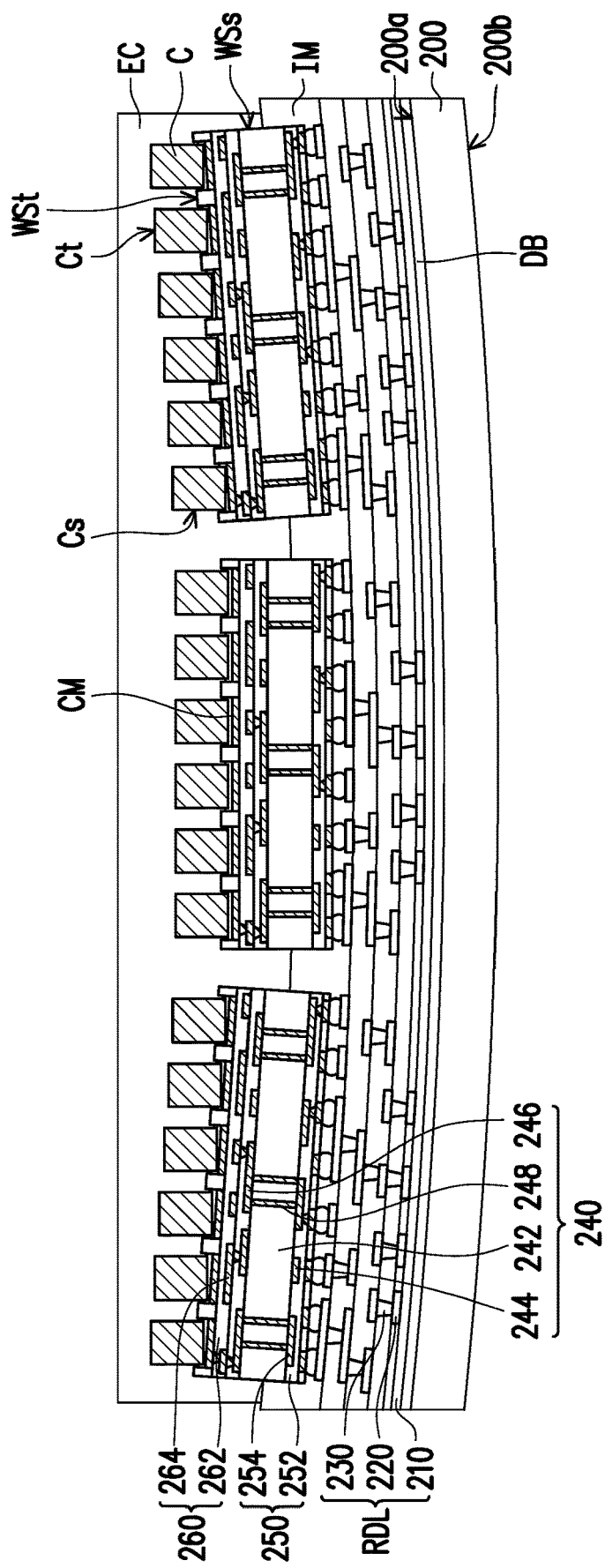

Referring to FIG. 1J, the temporary carrier 200, the redistribution structure RDL, and the wiring substrates WS are flipped together again. Then, an insulating encapsulation EC is formed on the wiring substrates WS and the conductive structures C. The insulating encapsulation EC encapsulates the top surfaces WSt of the wiring substrates WS, the top surface Ct of the conductive structures C, and the sidewalls Cs of the conductive structures C. In some embodiment, the insulating encapsulation EC further encapsulates a portion of the sidewalls WSs of the wiring substrates WS and in contact with the insulation material IM.

Figure 1K:
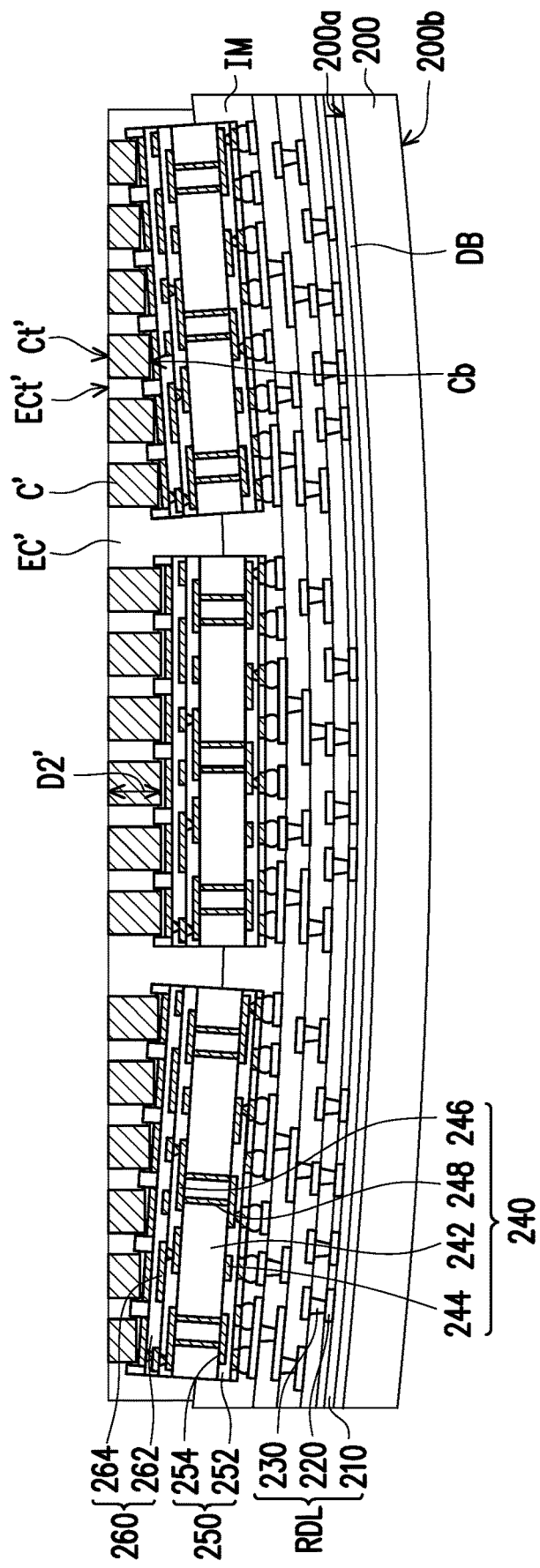

Referring to FIG. 1K, the insulating encapsulation EC and the conductive structures C are grinded to form the insulating encapsulation EC' and the conductive structures C'. The insulating encapsulation EC and the conductive structures C are grinded by a mechanical grinding and/or a chemical mechanical polishing (CMP), thereby the top surfaces Ct' of the conductive structures C' are exposed. In some embodiments, the grinding process is performed to level the insulating encapsulation EC' and the conductive structures C'. The conductive structures C' have different thickness D2' after being grinded. The conductive structures C' located at different positions have different removal amounts. In some embodiments, the conductive structures C' corresponding to the fallen stencil units 120 (referring to FIG. 1H) are thicker than the conductive structures C' corresponding to the other stencil units 120. In some embodiments, in some of the conductive structures C', the top surfaces Ct' of the conductive structures C' are coplanar while the bottom surfaces Cb of the conductive structures C' are not coplanar since the redistribution structure RDL (and the temporary carrier 200) is curved. The top surfaces Ct' of the conductive structures C' are coplanar with the top surface ECt' of the insulating encapsulation EC'. In some embodiments, the top surfaces Ct' of the conductive structures C' and the top surface ECt' of the insulating encapsulation EC' is not parallel to the first surface 200a of the temporary carrier 200.

Figure 1L:
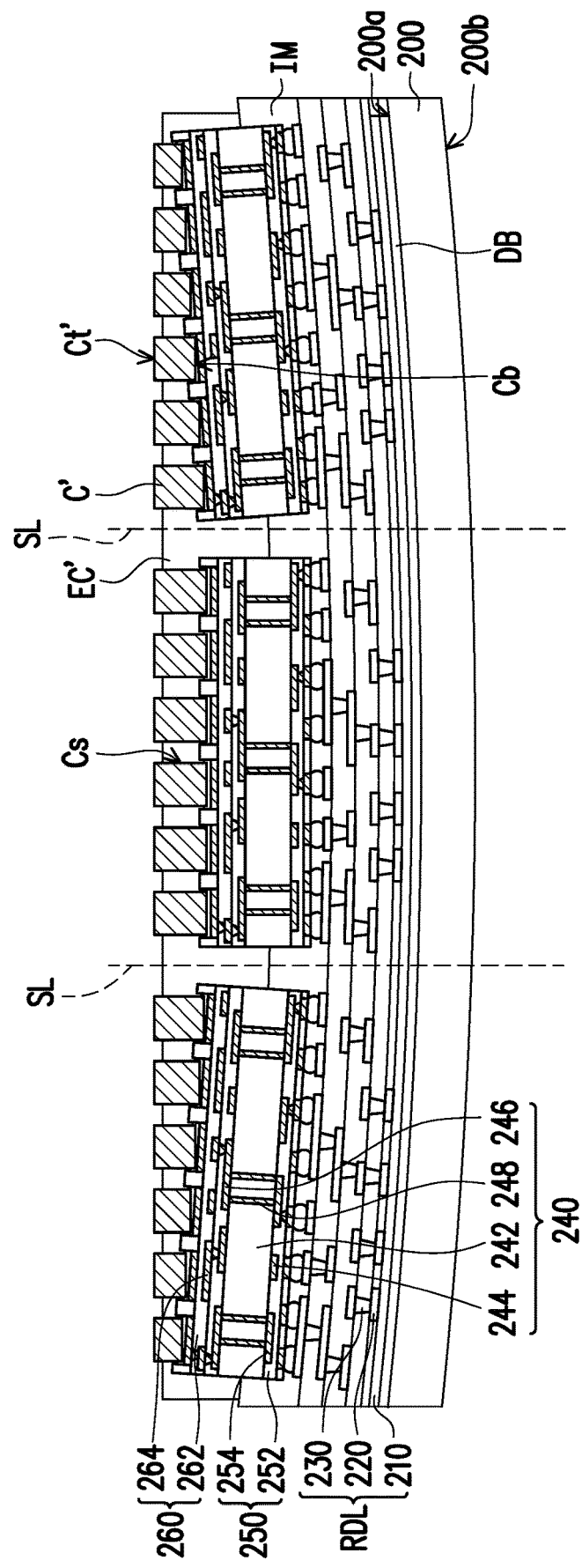
Figure 1M:
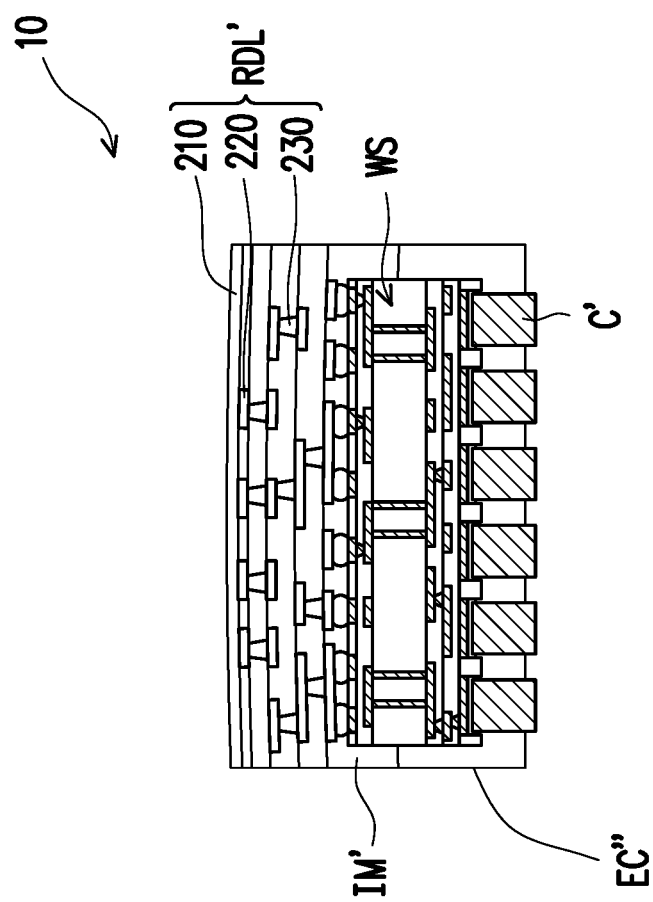

Referring to FIGS. 1L and 1M, an etch process, such as a plasma process, is performed on the insulating encapsulation EC' to expose a part of sidewalls Cs of the conductive structures C.

A singulation process is performed to singulate the insulating encapsulation EC', insulation material IM, and the redistribution structure RDL, so as to form a plurality of packages 10 having a redistribution circuit RDL' and one or more wiring substrate WS. The singulation process may be performed, by a mechanical sawing process, a laser cutting process, a laser micro-jet cutting process, or the like, to cut through and/or remove materials of the insulating encapsulation EC', insulation material IM, and the redistribution structure RDL, such that an insulating encapsulation EC", insulation material IM', and a redistribution circuit RDL' are formed. The dicing tool may cut along the cutting lines SL to form the packages 10. In some embodiments, the cutting lines SL are overlapping with the pre-cut grooves (not shown), thereby preventing the delamination of the redistribution circuit RDL' during the singulation process.

After the singulation process, the redistribution circuits RDL' are de-bonded from the de-bonding layer DB such that the redistribution circuits RDL' is separated from the temporary carrier 200. That is, the temporary carrier 200 is removed.

In some embodiments, the packages 10 may be placed on a tray cassette (not shown) and await to transfer to the next station or may ship to customers.

In this embodiment, the conductive structures C' of the packages 10 is formed by the stencil structure. By using stencil structure, the overturning problem or displacement problem of the conductive structures may be improved.

Figure 3:
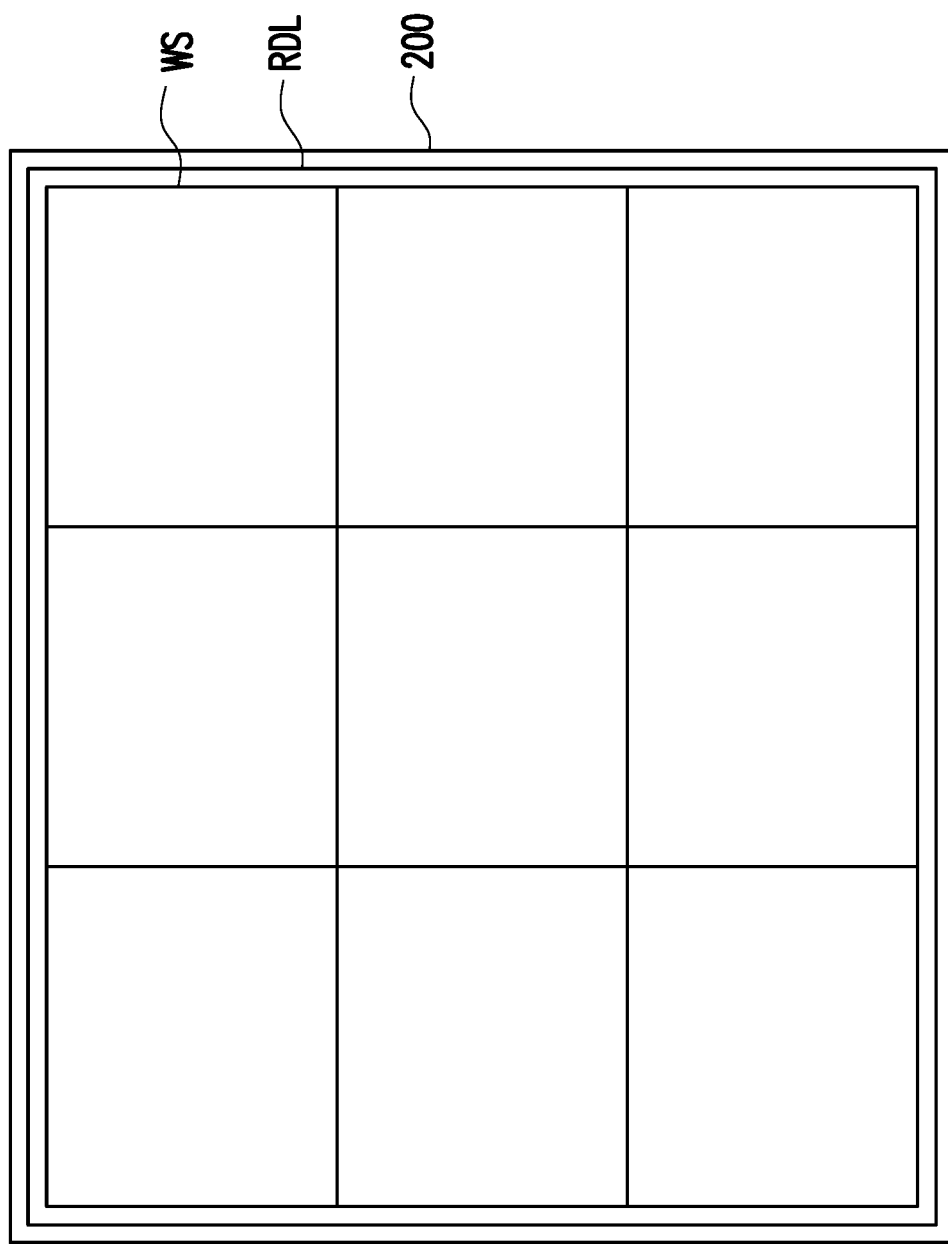
FIG. 3 is a schematic top view of a temporary carrier, a redistribution structure, and wiring substrates to some exemplary embodiments of the present disclosure.

FIG. 3 is a schematic top view of a temporary carrier, a redistribution structure, and wiring substrates to some exemplary embodiments of the present disclosure. Unless specified otherwise, the materials and the formation methods of the components described herein are essentially the same as the like components, which are denoted by like reference numerals shown in FIG. 1A to FIG. 1M.

Referring to FIG. 3, in this embodiment, the temporary carrier 200 is provided in a rectangular shape. The redistribution structure RDL and the wiring substrates WS are disposed on the temporary carrier 200.

Although only nine of the wiring substrates WS are illustrated for disposing on the redistribution structure RDL, the scope of the disclosure is not limited thereto. The number of the wiring substrates WS disposed on the redistribution structure RDL can be adjusted according to needs.

Figure 4:
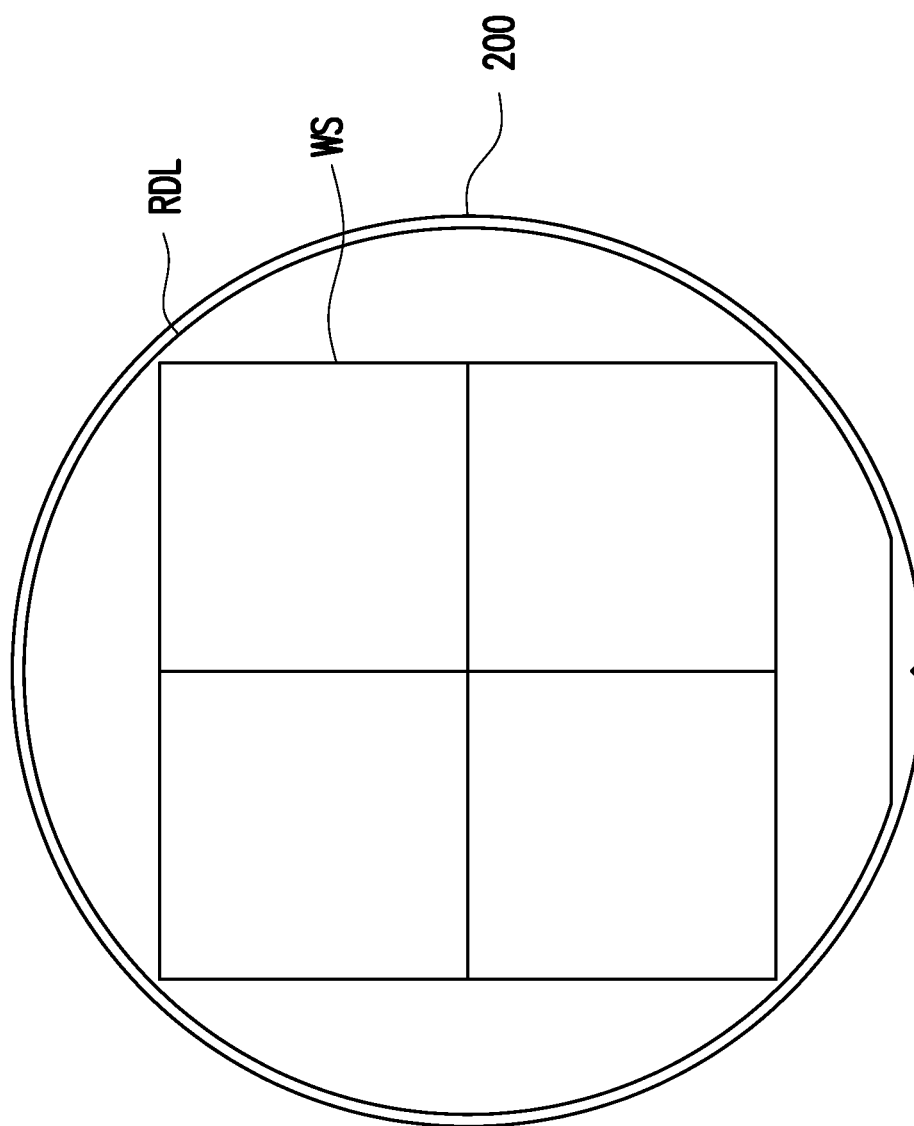
FIG. 4 is a schematic top view of a temporary carrier, a redistribution structure, and wiring substrates to some exemplary embodiments of the present disclosure.

FIG. 4 is a schematic top view of a temporary carrier, a redistribution structure, and wiring substrates to some exemplary embodiments of the present disclosure. Unless specified otherwise, the materials and the formation methods of the components described herein are essentially the same as the like components, which are denoted by like reference numerals shown in FIG. 1A to FIG. 1M.

Referring to FIG. 4, in this embodiment, the temporary carrier 200 is provided in a wafer form. The redistribution structure RDL and the wiring substrates WS are disposed on the temporary carrier 200.

Although only four of the wiring substrates WS are illustrated for disposing on the redistribution structure RDL, the scope of the disclosure is not limited thereto. The number of the wiring substrates WS disposed on the redistribution structure RDL can be adjusted according to needs.

Figure 5A:
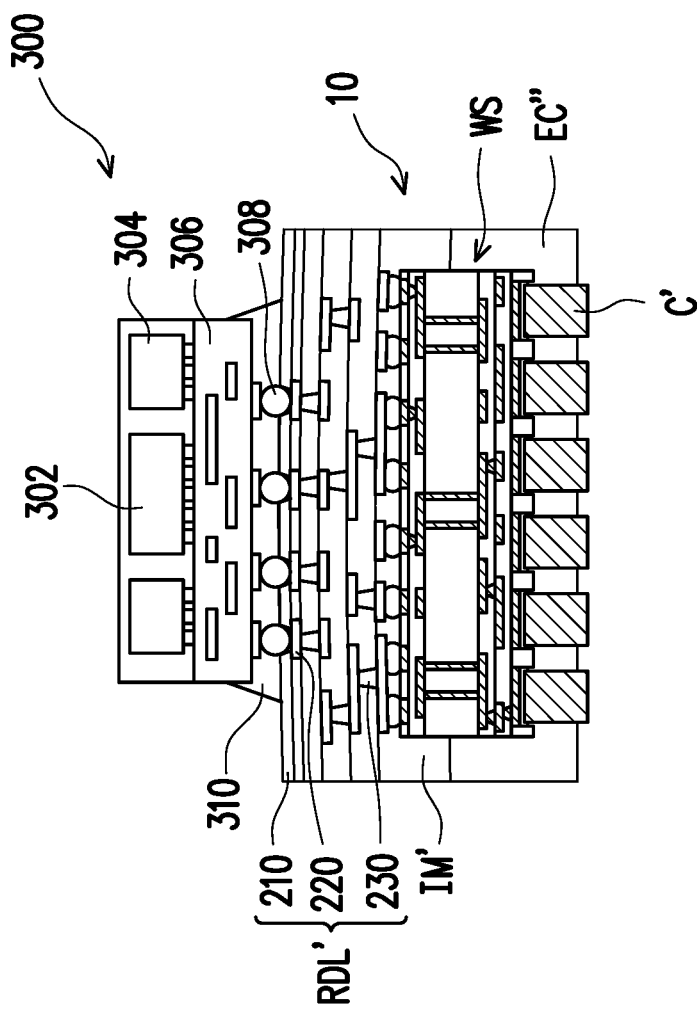
FIG. 5A to FIG. 5B are schematic cross-sectional views of various stages in a method of fabricating a semiconductor device according to some exemplary embodiments of the present disclosure.
Figure 5B:
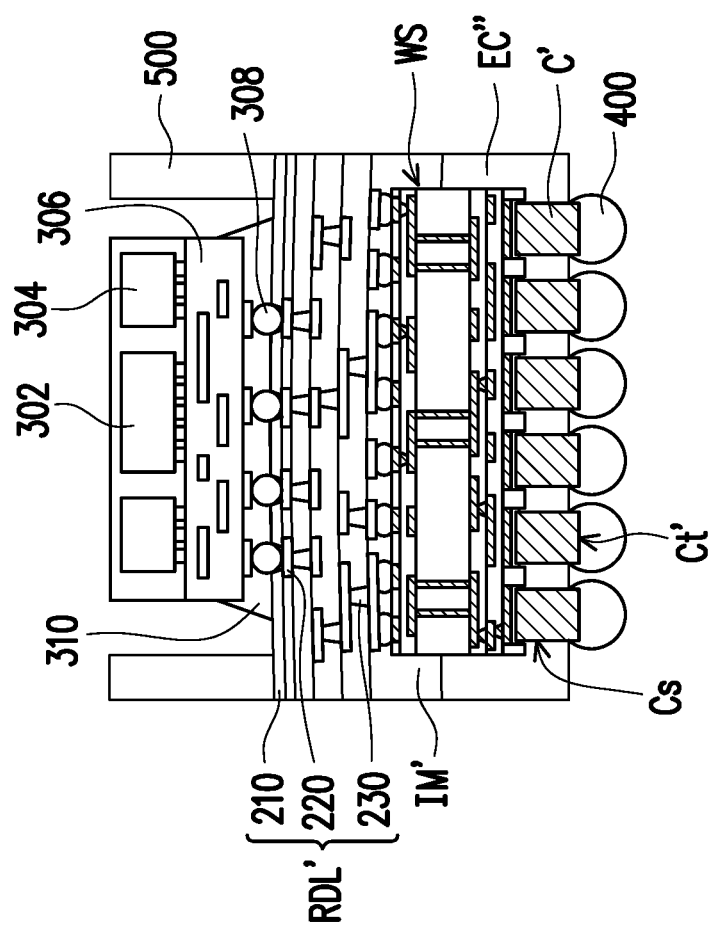

FIG. 5A to FIG. 5B are schematic cross-sectional views of various stages in a method of fabricating a semiconductor device according to some exemplary embodiments of the present disclosure.

Referring to FIG. 5A, a package 10 described in FIG. 1M is provided. A semiconductor device 300 is bonded to the redistribution circuit RDL' of the package 10. The semiconductor device 300 includes dies 302, 304 and redistribution structure 306. The dies 302, 304 are electrically couple with the redistribution structure 306. The semiconductor device 300 may be bonded to the redistribution circuit RDL' though the conductive joints 308 under the redistribution structure 306. A underfill material 310 may be applied on the redistribution circuit RDL' and laterally encapsulate the conductive joints 308.

Referring to FIG. 5B, conductive terminals 400 are formed on the conductive structures C' on the redistribution circuits RDL'. In some embodiments, the conductive terminals 400 are in contact with the sidewalls Cs of the conductive structures C' and the top surface Ct' of the conductive structures C'. The conductive terminals 400 may be or may include solder balls, ball grid array (BGA) connectors, or the like.

A ring structure 500 is provided on the redistribution circuits RDL'. The ring structure 500 may be used to sustain the heat spreader (not shown). In some embodiments, the ring structure 500 provides mechanical reinforcement for the package 10, and thus the warpage of the package 10 may be prevented.

Figure 6:
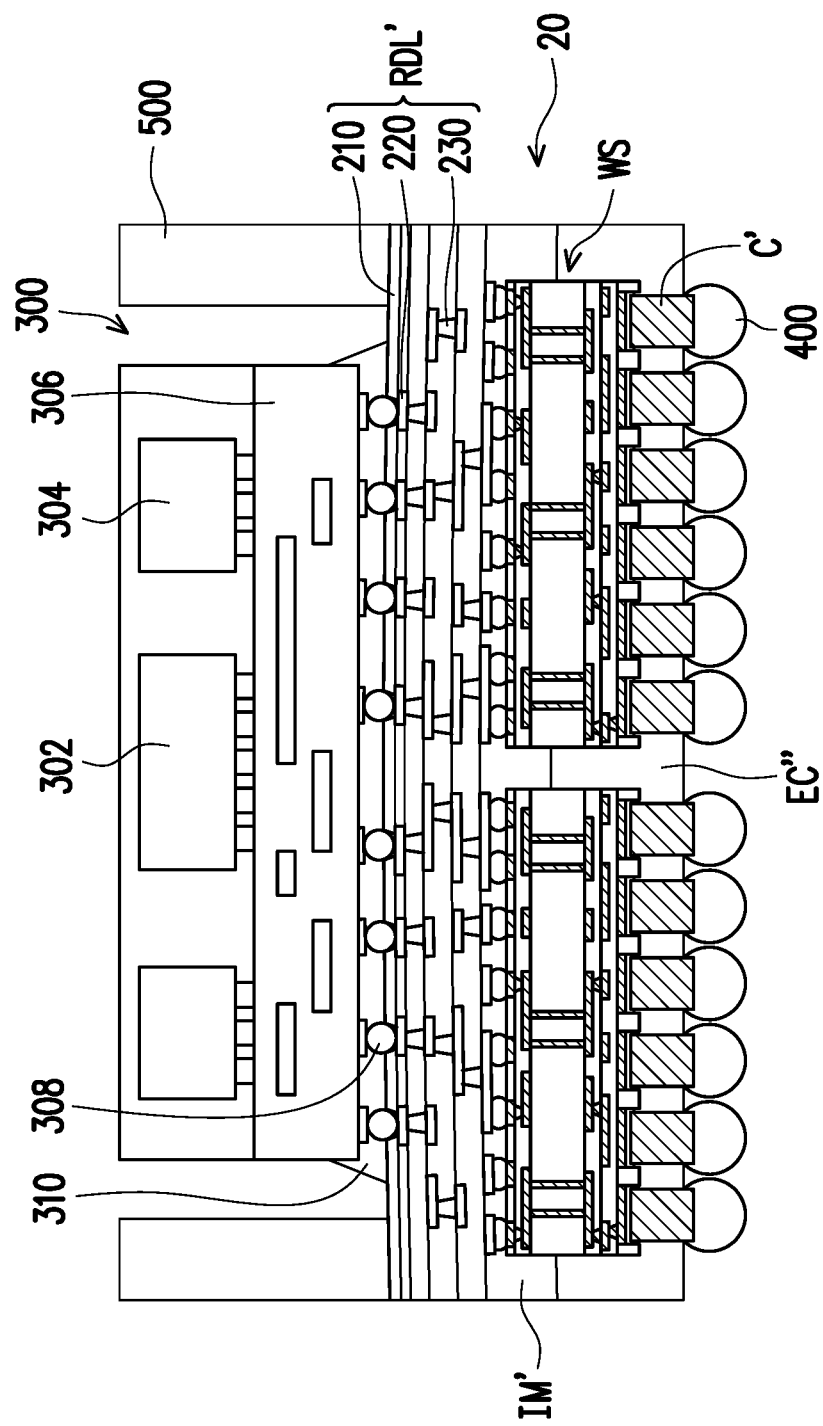
FIG. 6 is a schematic cross-sectional view of a semiconductor device according to some exemplary embodiments of the present disclosure.

FIG. 6 is a schematic cross-sectional view of a semiconductor device according to some exemplary embodiments of the present disclosure. Unless specified otherwise, the materials and the formation methods of the components described herein are essentially the same as the like components, which are denoted by like reference numerals shown in FIG. 5A to FIG. 5B.

Referring to FIG. 6, the package 20 includes a redistribution circuits RDL' and more than one of the wiring substrate WS. The package 20 can be fabricated by a method similar to the fabrication method described in FIG. 1A to FIG. 1M.

A semiconductor device 300 is bonded to the redistribution circuit RDL' of the package 20. Conductive terminals 400 are formed on the conductive structures C on the redistribution circuits RDL'. A ring structure 500 is provided on the redistribution circuits RDL'.

FIG. 7A to FIG. 7L are schematic cross-sectional views of various stages in a method of fabricating a package according to some exemplary embodiments of the present disclosure.

Figure 7A:
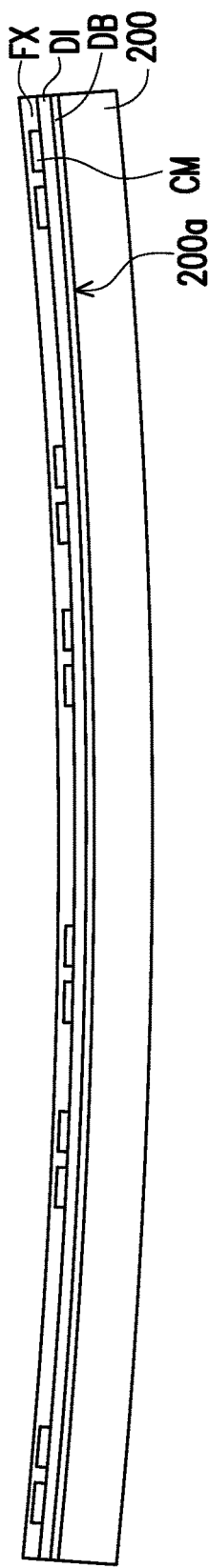
FIG. 7A to FIG. 7L are schematic cross-sectional views of various stages in a method of fabricating a package according to some exemplary embodiments of the present disclosure.

Referring to FIG. 7A, a temporary carrier 200 having a de-bonding layer DB and a dielectric layer DI is provided. Connection materials CM are disposed over the first surface 200a of the temporary carrier 200. For example, the connection materials CM are disposed on the dielectric layer DI over the first surface 200a. In some embodiments, the connection materials CM are pre-solders, such as pre-solder pastes. In an alternative embodiment, the connection materials CM may be pre-solder blocks. In some embodiments, the material of the connection materials CM may include a lead-free solder material (such as Sn—Ag base or Sn—Ag—Cu base materials) with or without additional impurity (such as Ni, Bi, Sb, Au, or the like). The disclosure is not limited thereto.

A flux FX is applied on the exposed top surface of the connection materials CM by, for example, flux-jetting techniques. In some embodiments, the flux FX covers the connection materials CM and the dielectric layer DI over the first surface 200a.

Figure 7B:
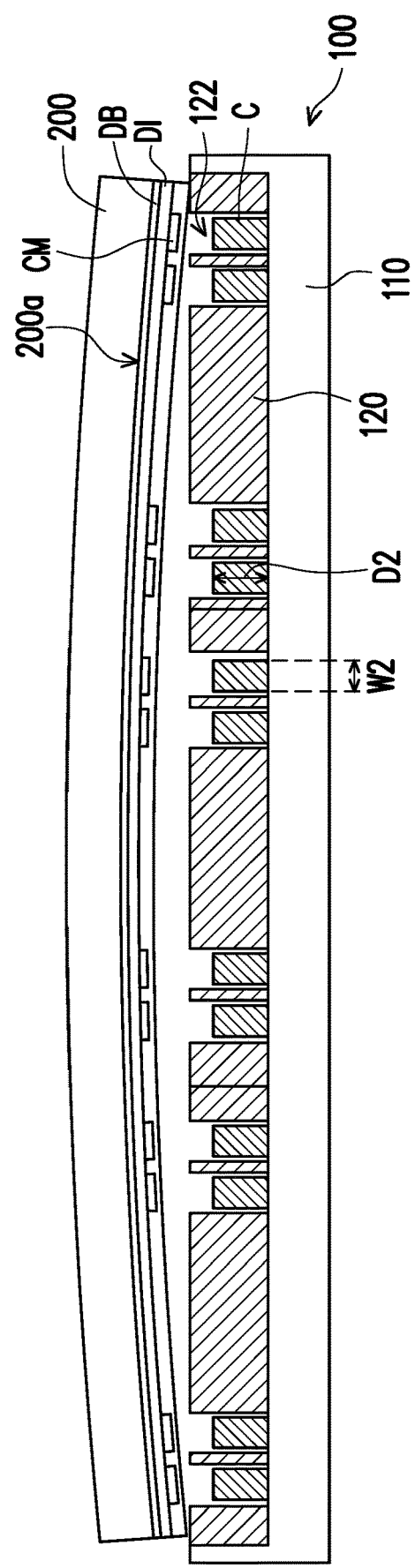

Referring to FIG. 7B, the temporary carrier 200 is flipped so as to turn the first surface 200a of the temporary carrier 200 downward, thereby the temporary carrier 200, covers a top surface of the stencil structure 100. The temporary carrier 200 is overlapping with the stencil structure 100, wherein the first surface 200a of the temporary carrier 200 faces the stencil structure 100. The connection materials CM on the temporary carrier 200 are overlapping with the openings 122 of the stencil units 120 and the conductive structures C in the openings 122.

In some embodiments, the size of each of the conductive structures C is smaller than or equal to the size of each of the openings 122. Therefore, the openings 122 can accommodate the conductive structures C. Each of the openings 122 can only accommodate one of the conductive structures C. A width W2 of each of the conductive structures C is in a range from 200 μm to 800 μm. A thickness D2 of each of the conductive structures C is in a range from 200 μm to 1500 μm.

The conductive structures C includes metal, such as copper, copper alloy or other conductive material. In some embodiments, the conductive structures C are conductive pillar, conductive ball, or conductive materials with other geometries. In some embodiments, each of the conductive structures C has the same shape with each of the openings 122 of the stencil units 120.

In some embodiments, each of the stencil units 120 comprises a center portion surrounded by the openings 122. The center portion of the stencil units 120 is designed without opening and is corresponding to a region used for deposition of die(s) or other semiconductor device(s) on the temporary carrier 200.

Figure 7C:
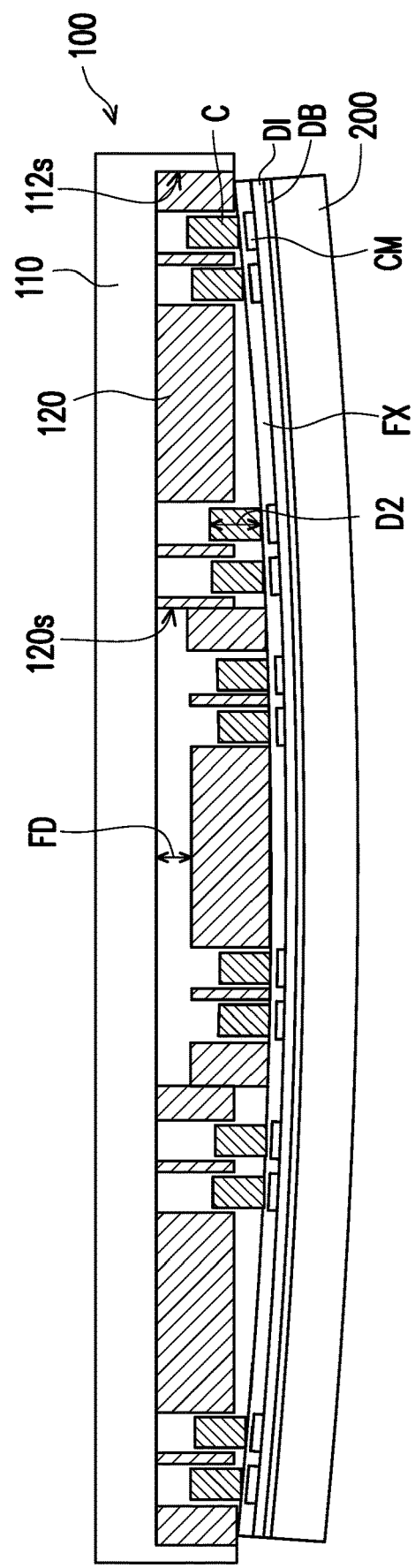

Referring to FIG. 7C, the temporary carrier 200 and the stencil structure 100 are flipped together. Then, the conductive structures C in the stencil units 120 are falling towards the connection materials CM. Each of the conductive structures C is disposed over one corresponding connection material CM. In some embodiments, the conductive structures C are disposed on the flux FX after flipping the structure. The conductive structures C may stick to the flux FX.

In some embodiments, since the first surfaces 200a of the temporary carrier 200 is curved, a distance between the stencil units 120 and the temporary carrier 200 are not all the same. Thus, sidewalls 120s of one or more of the stencil units 120 slide along sidewalls 120s of another stencil unit 120 or along sidewalls 112s of the groove 112 of the first carrier 110, and then the one or more of the stencil units 120 fall toward the temporary carrier 200. Base on the above, the arrangement of the conductive structures C in the fallen stencil units 120 can be maintained by the fallen stencil unit(s) 120, thereby preventing the overturning problem or the displacement problem of the conductive structures C. Therefore, the conductive structures C can accurately land on the connection materials CM in the subsequent process.

In some embodiments, a fall distance FD of the fallen stencil unit(s) 120 is smaller than, larger than or equal to the thickness D2 of the conductive structures C.

In some embodiments, before flipping the structure, the one or more of the stencil units 120 is not in contact with the flux FX. When flipping the structure, the one or more of the stencil units 120 will fall toward the flux FX and then in contact with the flux FX. That is, after flipping the structure, a vertical distance between the first carrier 110 and the one or more of the stencil units 120 is increased, and all of the stencil units 120 are in contact with the flux FX. In this embodiment, the flux FX is formed on the entire top surface of the dielectric layer DI, and the stencil units 120 may contact the flux FX. However, the disclosure is not limited thereto. In other embodiments, a patterned flux FX may be formed on the connection materials CM by screen printing or by using another stencil as mold. Under this circumstance, the stencil units 120 may not contact the patterned flux FX.

Figure 7D:
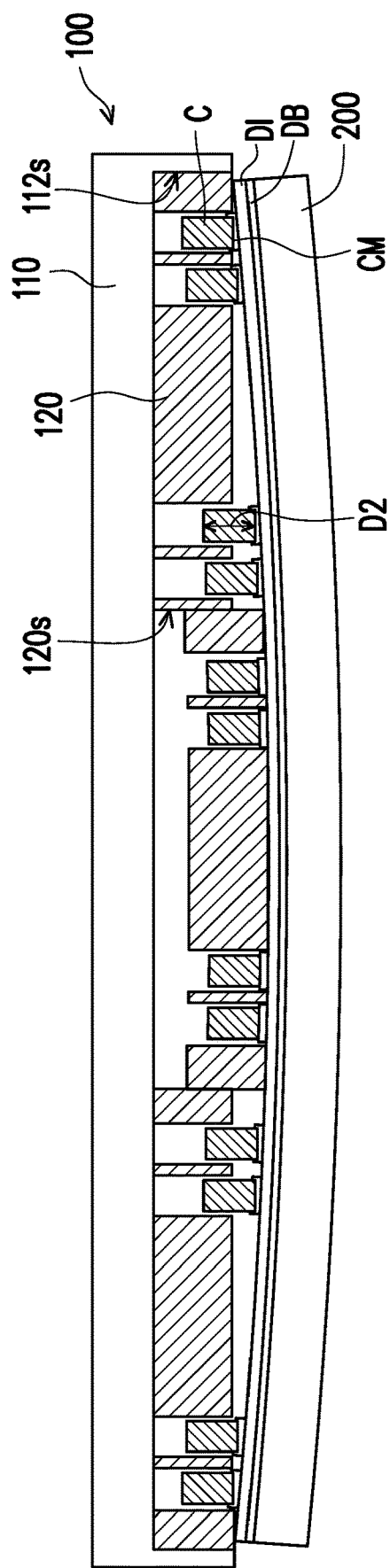

Referring to FIG. 7D, a heating process is performed to reflow the connection materials CM, thereby connecting the connection materials CM to the conductive structures C. The connection materials CM may thus join with the conductive structures C. In some embodiments, the flux FX may volatilize or diffuse into the connection materials CM after the heating process. That is, the flux FX is removed after the heating process. In some embodiments, after removing the flux FX, the stencil units 120 land on the dielectric layer DI. That is, after removing the flux FX, the stencil units 120 are in contact with the dielectric layer DI.

In some embodiments, an area of the top surface of each of the connection materials CM is larger than an area of the bottom surface of a corresponding conductive structure C. Therefore, the conductive structures C can land on the connection materials CM more easily. However, the disclosure is not limited thereto. In other embodiments, an area of the top surface of each of the connection materials CM is smaller than or equal to an area of the bottom surface of a corresponding conductive structure C, thereby preventing the connection between stencil units 120 and the connection materials CM. In some embodiments, the materials used for the stencil units 120 can not bond with the connection materials CM during the heating process. Therefore, the stencil units 120 are not fixed with the connection materials CM after the heating process even though the stencil units 120 are in contact with the connection materials CM.

In some embodiments, with the disappearance of the flux FX, the stencil units 120 and the first carrier 110 are falling toward the temporary carrier 200 until the stencil units 120 are in contact with the mask layer 270. However, the disclosure is not limited thereto. In other embodiments, the first carrier 110 is fixed in a certain height during the heating process. Therefore, after removing the flux FX by the heating process, the stencil units 120 are falling toward the temporary carrier 200 without the fall of the first carrier 110.

Figure 7E:
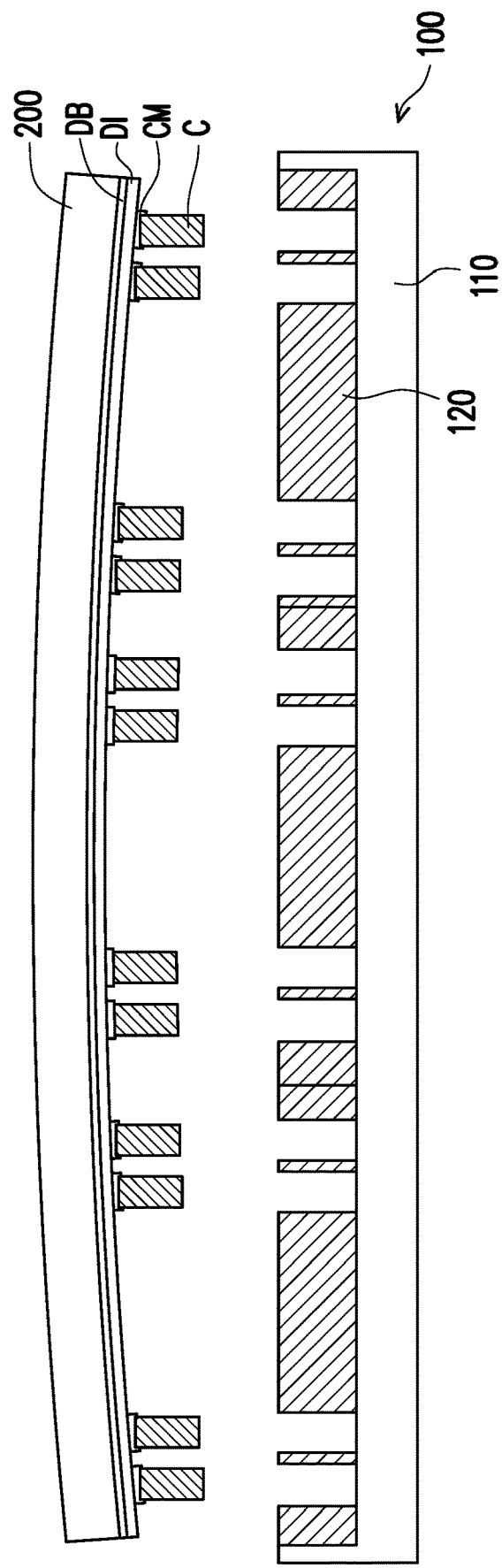

Referring to FIG. 7E, the temporary carrier 200 and the stencil structure 100 are flipped together again. Then, the one or more of the stencil units 120 is falling towards the first carrier 110 and return to the original position. The conductive structures C remain on the temporary carrier 200. Then, the stencil structure 100 is removed.

Figure 7F:
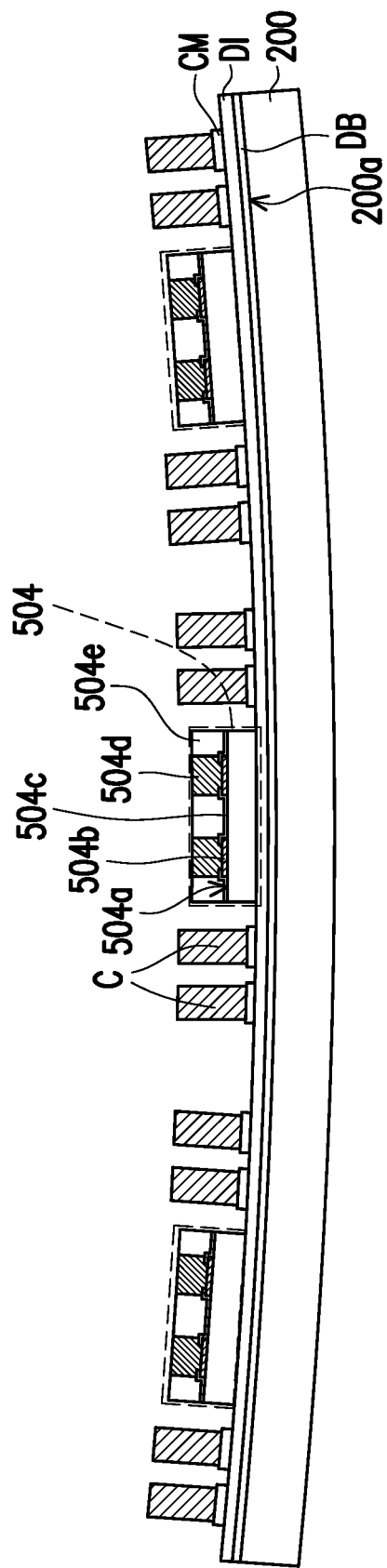

Referring to FIG. 7F, the temporary carrier 200 is flipped. A plurality of dies 504 are provided over the first surface 200a of the temporary carrier 200. The dies 504 are mounted onto the dielectric layer DI having the conductive structures C formed thereon. In some embodiments, a die attach film (DAF) (not illustrated) is located between the dies 504 and the dielectric layer DI for adhering the dies 504 onto the dielectric layer DI. The dies 504 are arranged in an array and are surrounded by the conductive structures C. The dies 504 are, for example, semiconductor dies. Each of the dies 504 includes an active surface 504a, a plurality of pads 504b distributed on the active surface 504a, a passivation layer 504c covering the active surface 504a, a plurality of conductive pillars 504d, and a protection layer 504e. The pads 504b are partially exposed by the passivation layer 504c. The conductive pillars 504d are disposed on and electrically connected to the pads 504b, and the protection layer 504e covers the conductive pillars 504d and the passivation layer 504c. The conductive pillars 504d are copper pillars or other suitable metal pillars, for example. In some embodiments, the protection layer 504e may be a polybenzoxazole (PBO) layer, a polyimide (PI) layer or other suitable polymers. In some alternative embodiments, the protection layer 504e may be made of inorganic materials. As illustrated in FIG. 7F, the top surfaces of the dies 504 are lower than the top surfaces of the adjacent conductive structures C. However, the disclosure is not limited thereto.

Figure 7G:
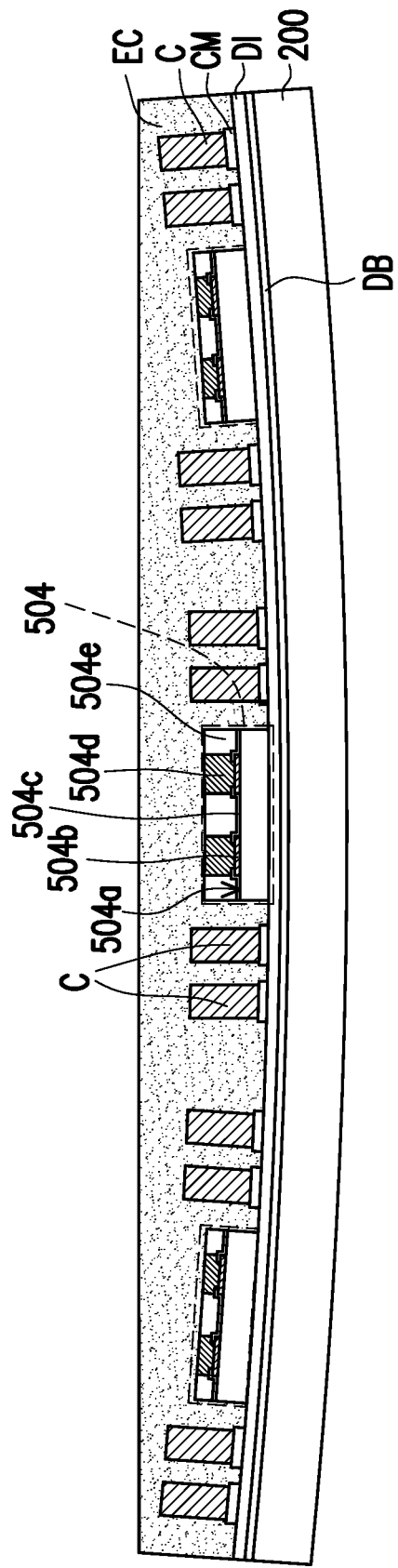

Referring to FIG. 7G, an insulating encapsulation EC is formed on the dielectric layer DI to encapsulate the conductive structures C and the dies 504. In some embodiments, the insulating encapsulation EC is a molding compound formed by a molding process. The conductive structures C and the protection layer 504e of the dies 504 are encapsulated by the insulating encapsulation EC. In other words, the conductive structures C and the protection layer 504e of the dies 504 are not revealed and are well protected by the insulating encapsulation EC. In some embodiments, the insulating encapsulation EC may include epoxy or other suitable materials.

Figure 7H:
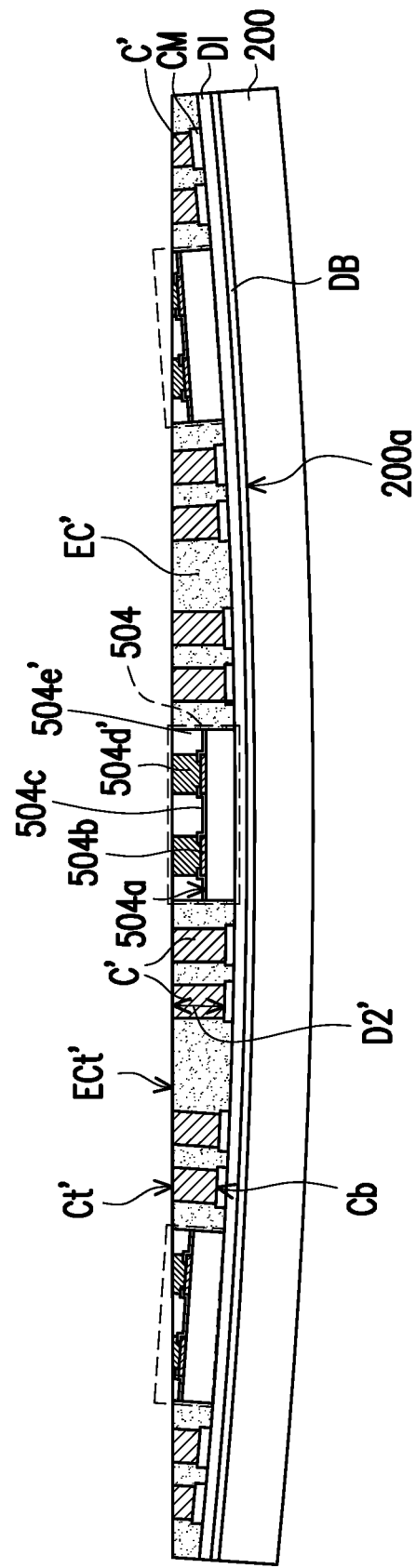

Referring to FIG. 7H, the insulating encapsulation EC and the protection layer 504e of the die 504 are grinded until the top surfaces of the conductive pillars 504d and the top surfaces of the conductive structures C are exposed. After the insulating encapsulation EC is grinded, an insulating encapsulation EC' is formed over the dielectric layer DI. During the aforementioned grinding process, portions of the protection layer 504e are also grinded to form a protection layer 504e'. In some embodiments, during the aforementioned grinding process of the insulating encapsulation EC and the protection layer 504e, portions of the conductive pillars 504d and portions of the conductive structures C are grinded to form the conductive pillars 504d' and the conductive structures C'.

The conductive structures C' have different thickness D2' after being grinded. The conductive structures C' located at different positions have different removal amounts. In some embodiments, the conductive structures C' corresponding to the fallen stencil units 120 (referring to FIG. 7C) are thicker than the conductive structures C' corresponding to the other stencil units 120. In some embodiments, in some of the conductive structures C', the top surfaces Ct' of the conductive structures C' are coplanar while the bottom surfaces Cb of the conductive structures C' are not coplanar since the temporary carrier 200 has the non-flat surface (the first surface 200a). The top surfaces Ct' of the conductive structures C' are coplanar with the top surface ECt' of the insulating encapsulation EC'. In some embodiments, the top surfaces Ct' of the conductive structures C' and the top surface ECt' of the insulating encapsulation EC' is not parallel to the first surface 200a of the temporary carrier 200.

Figure 7I:
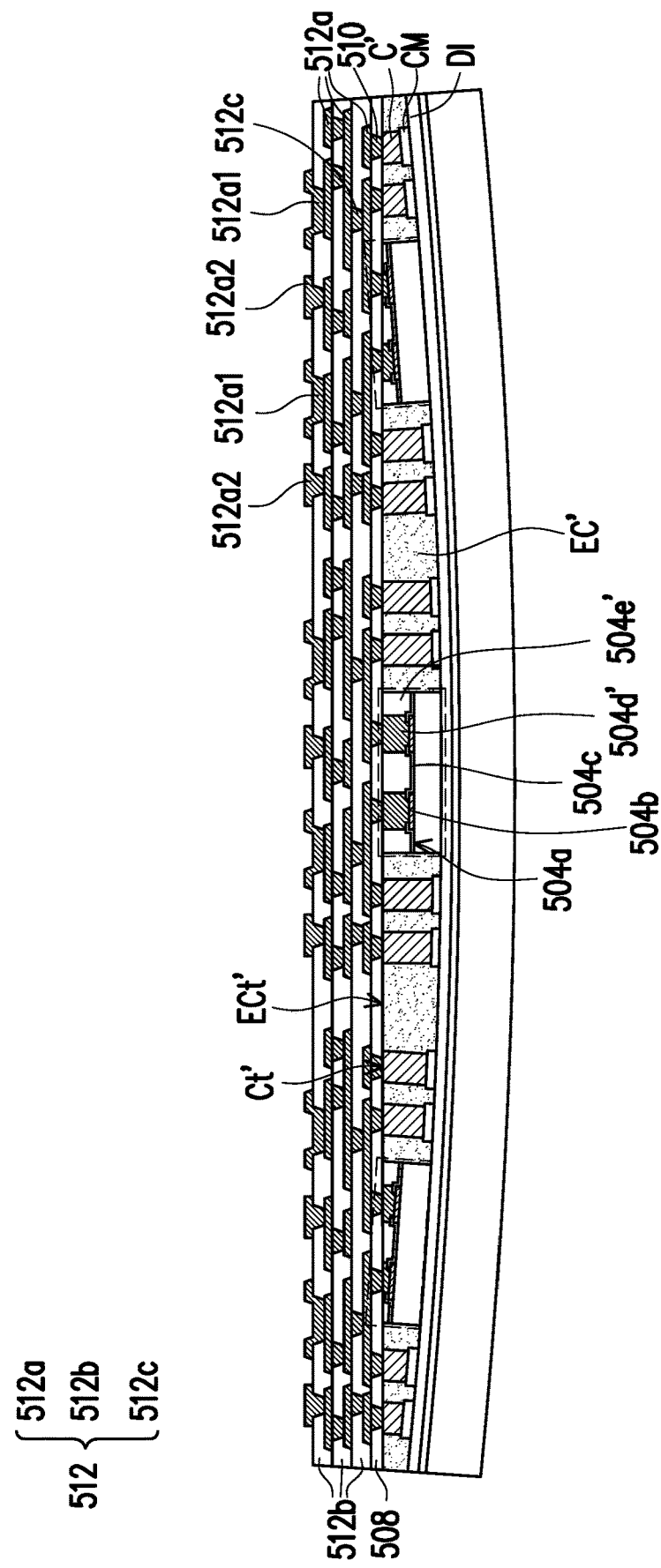

Referring to FIG. 7I, after the insulating encapsulation EC' and the conductive structures C' are formed, a dielectric layer 508 is formed over the top surfaces Ct' of the conductive structures C', the top surface of the insulating encapsulation EC', the top surfaces of the conductive pillars 504d', and the top surface of the protection layer 504e'. In some embodiments, the dielectric layer 508 is, for example, polymer such as polyimide, benzocyclobutene (BCB), polybenzoxazole (PBO), or the like. In some alternative embodiments, the dielectric layer 508 may include non-organic dielectric materials such as silicon oxide, silicon nitride, silicon carbide, silicon oxynitride, or the like. Then, a plurality of vias 510 are formed in the dielectric layer 508, where each of the vias 510 is electrically connected to either one of the conductive pillars 504d' of the die 504 or one of the conductive structures C'. In some embodiments, a plurality of openings (not shown) are formed in the dielectric layer 508, and then the vias 510 are formed in the openings respectively. In some embodiments, the top surfaces of the conductive pillars 504d' and the top surfaces Ct' of the conductive structures C' are in contact with the vias 510. In some embodiments, the vias 510 are copper vias or other suitable metal vias, for example. In some embodiments, the via 510 may include a seed layer and a conductive layer thereon, for example.

A redistribution structure 512 electrically connected to the vias 510 is formed on the top surface of the dielectric layer 508. As shown in FIG. 7I, the redistribution structure 512 includes conductive patterns 512a, dielectric layers 512b and conductive vias 512c, wherein the conductive patterns 512a and the dielectric layers 512b are stacked alternately. In some embodiments, the conductive patterns 512a are electrically connected to the vias 510 embedded in the dielectric layer 508, where the top surfaces of the vias 510 are in contact with the bottommost conductive patterns 512a of the redistribution structure RDL. Furthermore, the topmost conductive patterns 512a include a plurality of pads. In some embodiments, the aforementioned pads include a plurality of under-ball metallurgy (UBM) patterns 512a1 for ball mount and/or at least one connection pads 512a2 for mounting of passive components. The number of the under-ball metallurgy patterns 512a1 and the connection pad 512a2 is not limited in this disclosure.

Figure 7J:
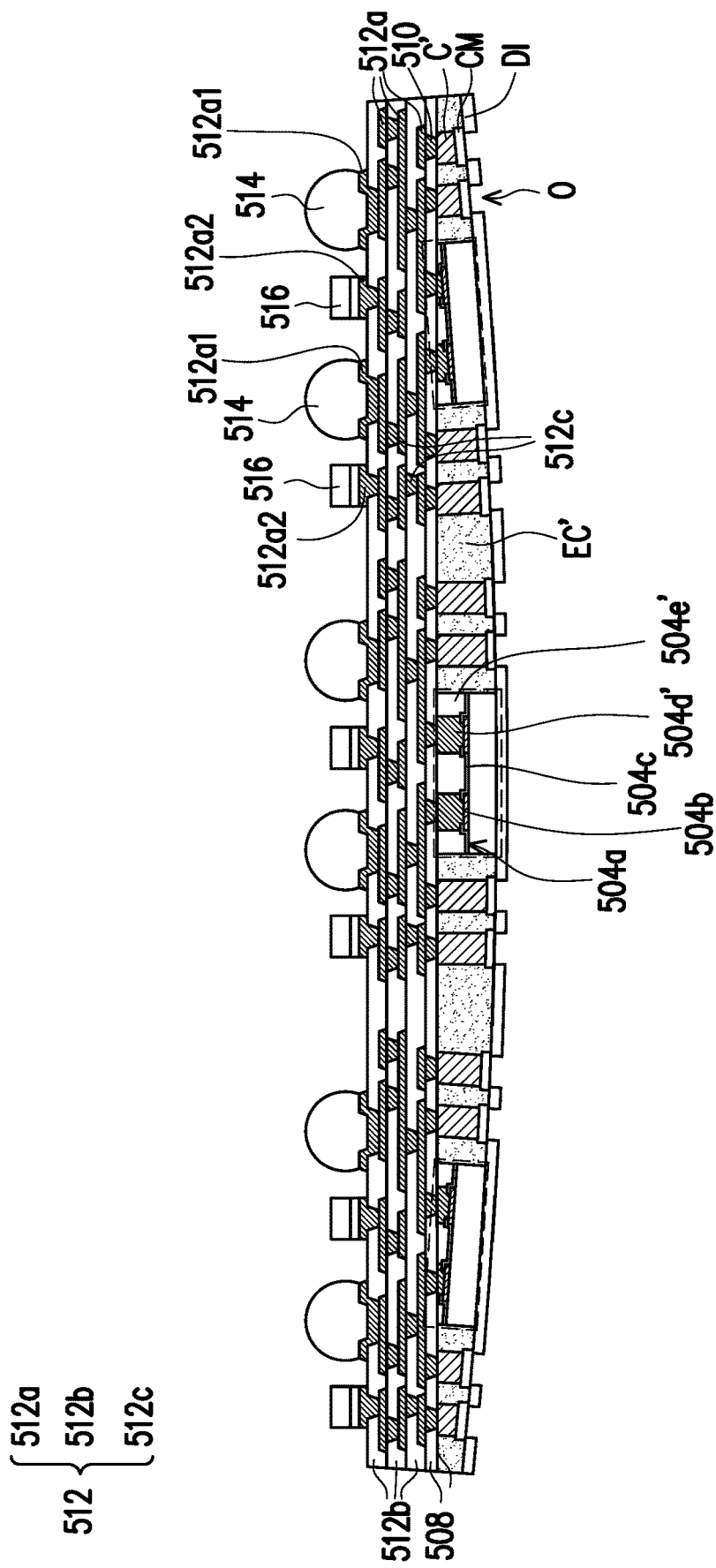

Referring to FIG. 7J, after the redistribution structure 512 is formed, a plurality of conductive terminals 514 are placed on the under-ball metallurgy patterns 512a1, and a plurality of passive components 516 are mounted on the connection pads 512a2. In some embodiments, the conductive terminals 514 may be placed on the under-ball metallurgy patterns 512a1 through a ball placement process or other suitable processes and the passive components 516 may be mounted on the connection pads 512a2 through a soldering process, a reflowing process, or other suitable processes.

Referring to FIG. 7J, after the conductive terminals 514 and the passive components 516 are mounted on the redistribution structure RDL, the dielectric layer DI is de-bonded from the de-bonding layer DB such that the dielectric layer DI is separated from the temporary carrier 200. That is, the temporary carrier 200 is removed. In some embodiments, the de-bonding layer DB (e.g., the LTHC release layer) may be irradiated by an UV laser such that the dielectric layer DI adhered on the bottom surface of the encapsulant EC' is peeled from the temporary carrier 200. As illustrated in FIG. 7J, the dielectric layer DI is then patterned such that a plurality of contact openings O is formed to partially expose the connection materials CM under the conductive structures C'. The number of the contact openings O corresponds to the number of the conductive structures C'. In some embodiments, the contact openings O of the dielectric layer DI are formed by a laser drilling process, a mechanical drilling process, or other suitable processes.

Figure 7K:
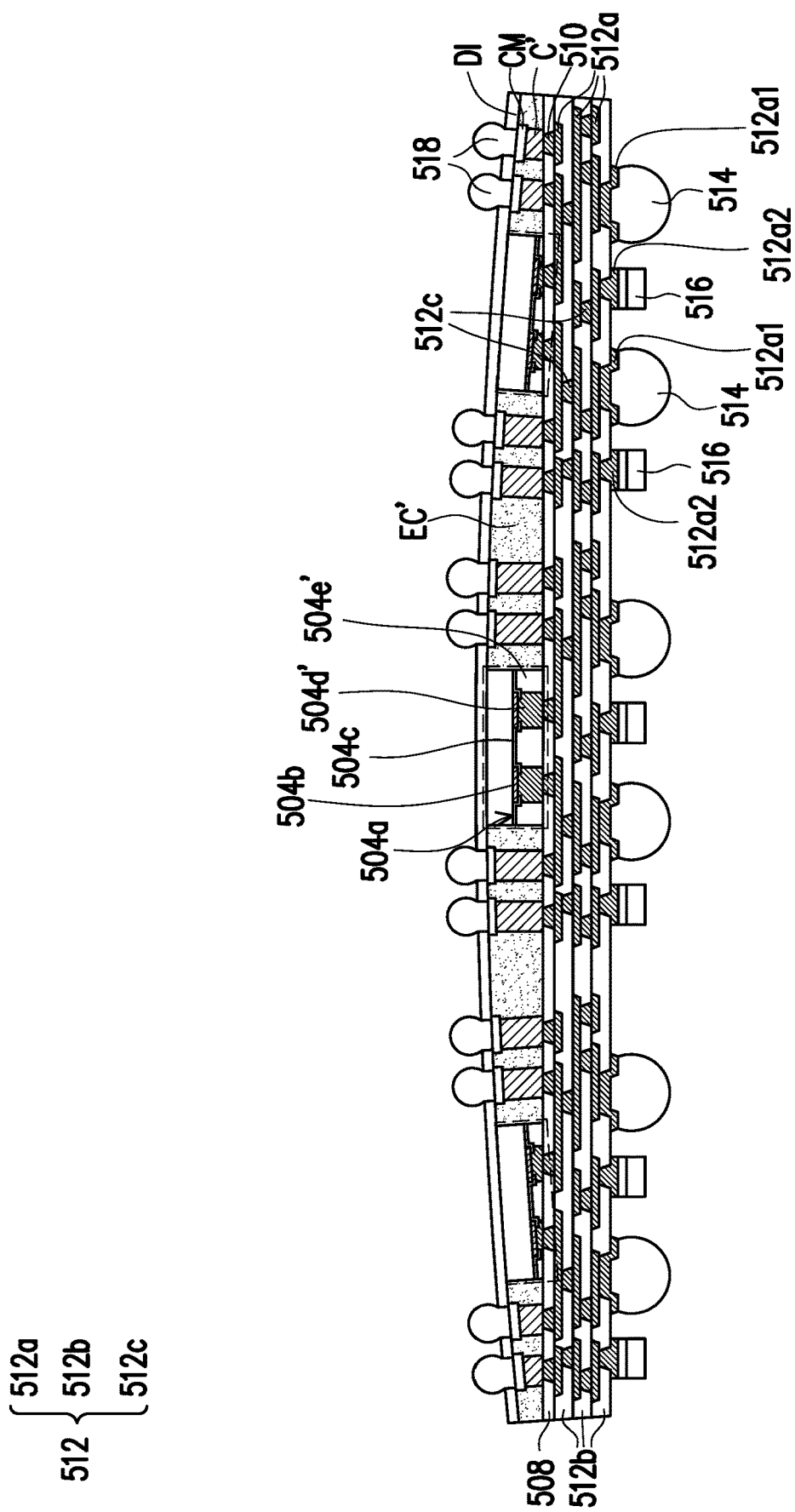

Referring to FIG. 7K, after the contact openings O are formed in the dielectric layer DI, a plurality of conductive terminals 518 are placed in the contact openings O, and the conductive terminals 518 are electrically connected to the conductive structures C'. Herein, formation of an integrated fan-out (INFO) package array is substantially completed.

Figure 7L:
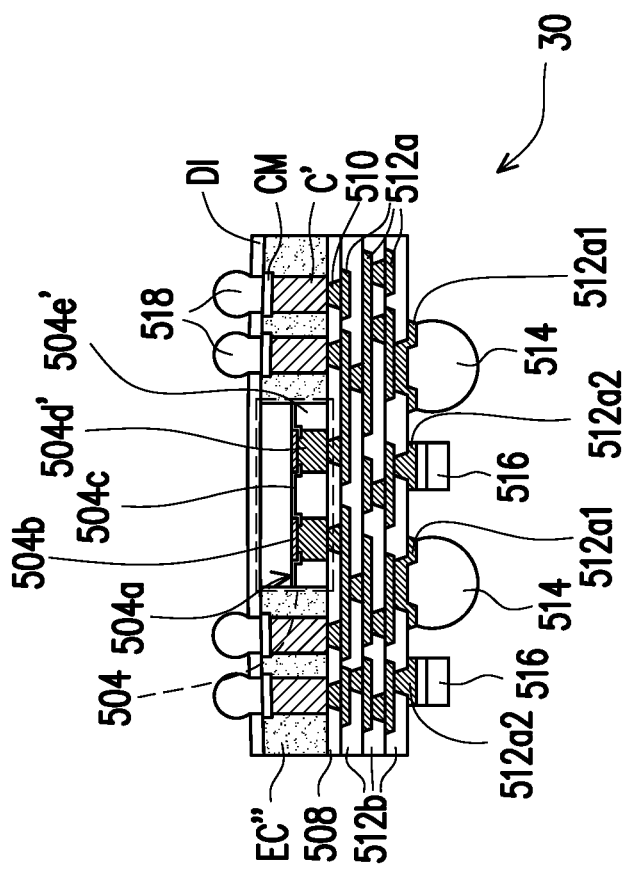

As illustrated in FIG. 7L, after the conductive terminals 514 and the conductive terminals 518 are formed, the INFO package array is diced to form a plurality of INFO packages 30 having dual-side terminal design. A singulation process is performed to singulate the insulating encapsulation EC' and the redistribution structure 512, so as to form a plurality of packages 30 having an insulating encapsulation EC", a redistribution circuit 512' and one or more die 504. The dicing tool may cut along the cutting lines SL to form the packages 10. In some embodiments, the cutting lines SL are overlapping with the pre-cut grooves (not shown), thereby preventing the delamination of the redistribution circuit RDL' during the singulation process.

In some embodiment, the dicing process or singulation process typically involves dicing with a rotating blade or a laser beam. In other words, the dicing or singulation process is, for example, a laser cutting process, a mechanical cutting process, or other suitable processes. In some alternative embodiments, the INFO package 30 may be stack with other electronic devices such as another INFO package, a memory device, a ball grid array (BGA), or a wafer. For example, another package such an IC package may be stacked over and electrically connected to the INFO package 30 through the conductive terminals 518 such that the package-on-package (POP) structure is fabricated.

In accordance with some embodiments of the disclosure, a method of fabricating a package includes the following steps. A stencil structure is provided, wherein the stencil structure includes a first carrier and stencil units disposed on the first carrier, wherein each of the stencil units has openings. Conductive structures are provided in the openings of the stencil units. A temporary carrier having a first surface and a second surface opposite to the first surface is provided, wherein connection materials are disposed over the first surface. The first surface of the temporary carrier is turned downward and covering a top surface of the stencil structure. The temporary carrier and the stencil structure are flipped, and then the conductive structures in the stencil units are falling towards the connection materials. The stencil structure is removed. An insulating encapsulation is formed to encapsulate the conductive structures. The insulating encapsulation is grinded.

In accordance with some embodiments of the disclosure, a method of fabricating a package includes the following steps: A stencil structure is provided, wherein the stencil structure includes a first carrier and stencil units disposed in a groove of the first carrier, wherein each of the stencil units has openings. Conductive structures are provided in the openings of the stencil units. A temporary carrier is provided, wherein connection materials are disposed over a first surface of the temporary carrier. The temporary carrier and the stencil structure are overlapped, wherein the first surface of the temporary carrier faces the stencil structure and the connection materials are overlapping with the openings of the stencil units. The temporary carrier and the stencil structure are flipped together to dispose the conductive structures over the temporary carrier, wherein sidewalls of at least one of the stencil units slide along sidewalls of another stencil unit or along sidewalls of the groove of the first carrier. The conductive structures and the connection materials are connected. The stencil structure is removed. An insulating encapsulation is formed to encapsulate the conductive structures. The insulating encapsulation is grinded.

In accordance with some embodiments of the disclosure, a stencil structure includes a first carrier having a groove and stencil units placed in the groove of the first carrier. At least one of the stencil units is slidably disposed along sidewalls of another stencil unit. Each of the stencil units has openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package, comprising:
providing a system comprising:
a structure and a vibrator, wherein the structure comprises:
a carrier; and
plates, disposed in a groove of the carrier, wherein each of the plates has a plurality of openings configured to accommodate a plurality of conductive terminals, wherein at least one of the plates is slidably disposed along sidewalls of another plate;
providing the plurality of conductive terminals above the plates, and introducing the plurality of conductive terminals into the plurality of openings of each of the plates by the vibrator;
providing a temporary carrier having a first surface and a second surface opposite to the first surface, wherein connection materials are disposed over the first surface;
turning the first surface of the temporary carrier downward and covering a top surface of the structure;
flipping the temporary carrier and the structure, and then the plurality of conductive terminals in the plates are falling towards the connection materials;
removing the structure;
forming an insulating encapsulation to encapsulate the plurality of conductive terminals; and
grinding the insulating encapsulation.

2. The method of claim 1, further comprises:
forming a flux on the connection materials; and
reflowing the connection materials so as to connect the connection materials to the plurality of conductive terminals.

3. The method of claim 1, further comprises:
performing a etch process on the insulating encapsulation to expose a part of sidewalls of the plurality of conductive terminals after grinding the insulating encapsulation.

4. The method of claim 1, wherein:
a redistribution structure is disposed over the first surface of the temporary carrier, wiring substrates are disposed over the redistribution structure, and the connection materials are disposed over the wiring substrates, wherein the redistribution structure is curved.

5. The method of claim 4, further comprises:
a singulation process is performed to singulate the redistribution structure to form redistribution circuits;
bonding a semiconductor device on one of the redistribution circuits; and
forming conductive connectors on the plurality of conductive terminals on the redistribution circuits.

6. The method of claim 1, further comprises:
disposing dies on the first surface of the temporary carrier; and
forming the insulating encapsulation to encapsulate the plurality of conductive terminals and the dies.

7. The method of claim 1, wherein when flipping the temporary carrier and the structure, the sidewalls of the at least one of the plates slide along the sidewalls of the another plate or along sidewalls of the groove of the carrier.

8. The method of claim 7, wherein the insulating encapsulation and the plurality of conductive terminals are grinded together, and the plurality of conductive terminals have different thickness after being grinded.

9. A method of fabricating a package, comprising:
providing a system comprising:
a structure and a vibrator, wherein the structure comprises:
a carrier; and
plates, disposed in a groove of the carrier, wherein each of the plates has a plurality of openings configured to accommodate a plurality of conductive terminals, wherein at least one of the plates is slidably disposed along sidewalls of another plate;
providing the plurality of conductive terminals above the plates, and introducing the plurality of conductive terminals into the plurality of openings of each of the plates by the vibrator;
providing a temporary carrier, wherein connection materials are disposed over a first surface of the temporary carrier;
overlapping the temporary carrier and the structure, wherein the first surface of the temporary carrier faces the structure and the connection materials are overlapping with the plurality of openings of the plates;
flipping the temporary carrier and the structure together to dispose the plurality of conductive terminals over the temporary carrier, wherein the sidewalls of the at least one of the plates slide along the sidewalls of the another plate or along sidewalls of the groove of the carrier;
connecting the plurality of conductive terminals and the connection materials;
removing the structure;
forming an insulating encapsulation to encapsulate the plurality of conductive terminals; and
grinding the insulating encapsulation.

10. The method of claim 9, wherein:
a redistribution structure is disposed over the first surface of the temporary carrier, wiring substrates are disposed over the redistribution structure, and the connection materials are disposed over the wiring substrates.

11. The method of claim 10, further comprises:
a singulation process is performed to singulate the redistribution structure to form redistribution circuits;

bonding a semiconductor device on one of the redistribution circuits; and forming conductive connectors on the plurality of conductive terminals on the redistribution circuits.

12. The method of claim 9, further comprises:

disposing dies on the first surface of the temporary carrier; and forming the insulating encapsulation to encapsulate the plurality of conductive terminals and the dies, wherein after flipping the temporary carrier and the structure together, a vertical distance between the at least one of the plates and the carrier is increased.

13. A system for transferring a plurality of conductive terminals, comprising:

a structure, comprising:

a carrier having a groove; and plates, placed in the groove of the carrier, wherein at least one of the plates is slidably disposed along sidewalls of another plate, and each of the plates has a plurality of openings configured to accommodate the plurality of conductive terminals; and a vibrator configured to introduce the plurality of conductive terminals into the plurality of openings of each of the plates.

14. The system of claim 13, wherein each of the plurality of openings of the plates has a same size.

15. The system of claim 13, wherein each of the plurality of openings of the plates has a cylinder shape.

16. The system of claim 13, wherein the plurality of openings of the plates are through holes of the plates.

17. The system of claim 13, wherein each of the plates is slidably disposed along sidewalls of an adjacent plate.

18. The system of claim 13, wherein sidewalls of the at least one of the plates are perpendicular to a bottom surface of the groove of the carrier, wherein the structure is flip on a warped substrate to transfer the plurality of conductive terminals onto the warped substrate.

19. The system of claim 13, wherein sidewalls of the at least one of the plates are perpendicular to a bottom surface of the groove of the carrier, and wherein a first plate among the plates and a second plate among the plates are located at different level heights when the structure is flip on at least one wiring substrate.

20. The system of claim 13, wherein the plates are in contact with a bottom surface of the groove of the carrier.

* * * * *